United States Patent
Sim

(10) Patent No.: US 8,754,464 B2
(45) Date of Patent: Jun. 17, 2014

(54) NON-VOLATILE MEMORY DEVICES INCLUDING GATES HAVING REDUCED WIDTHS AND PROTECTION SPACERS AND METHODS OF MANUFACTURING THE SAME

(75) Inventor: Jae-Hwang Sim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/468,552

(22) Filed: May 10, 2012

(65) Prior Publication Data

US 2012/0313159 A1    Dec. 13, 2012

(30) Foreign Application Priority Data

Jun. 13, 2011   (KR) .................. 10-2011-0056993

(51) Int. Cl.
*H01L 29/76* (2006.01)
*H01L 29/792* (2006.01)
*H01L 29/788* (2006.01)

(52) U.S. Cl.
USPC .................... 257/314; 257/324; 257/E21.626

(58) Field of Classification Search
CPC ........................... H01L 29/788; H01L 29/792
USPC .................. 257/315, 316, 314, 324, E21.626
See application file for complete search history.

(56) References Cited

U.S. PATENT DOCUMENTS

| | | | | |
|---|---|---|---|---|
| 6,486,505 B1* | 11/2002 | Rupp et al. | ..................... | 257/306 |
| 2004/0005760 A1* | 1/2004 | Rudeck et al. | ................. | 438/257 |
| 2008/0195916 A1 | 8/2008 | Lee et al. | | |
| 2008/0315280 A1* | 12/2008 | Watanabe et al. | ............. | 257/315 |
| 2009/0212345 A1 | 8/2009 | Lee | | |
| 2009/0289296 A1* | 11/2009 | Jeon | .............................. | 257/321 |
| 2012/0146125 A1 | 6/2012 | Kim et al. | | |

FOREIGN PATENT DOCUMENTS

| | | |
|---|---|---|
| JP | 2008-108787 | 5/2008 |
| KR | 1020060133166 A | 12/2006 |
| KR | 1020090090622 A | 8/2009 |
| KR | 1020100013946 A | 2/2010 |

* cited by examiner

*Primary Examiner* — Tucker Wright
*Assistant Examiner* — Mark Hatzilambrou
(74) *Attorney, Agent, or Firm* — Myers Bigel Sibley & Sajovec, P.A.

(57) ABSTRACT

Non-volatile memory devices and methods of manufacturing the same are disclosed. In a non-volatile memory device, widths of a metal gate and an upper portion of a base gate in a gate electrode are less than the width of a hard mask pattern disposed on the metal gate. First and second protection spacers are disposed on opposing sidewalls of the metal gate and on opposing sidewalls of the upper portion of the base gate, respectively.

12 Claims, 16 Drawing Sheets

US 8,754,464 B2

NON-VOLATILE MEMORY DEVICES INCLUDING GATES HAVING REDUCED WIDTHS AND PROTECTION SPACERS AND METHODS OF MANUFACTURING THE SAME

CROSS-REFERENCE TO RELATED APPLICATIONS

This U.S. non-provisional patent application claims priority under 35 U.S.C. §119 to Korean Patent Application No. 10-2011-0056993, filed on Jun. 13, 2011, the entirety of which is incorporated by reference herein.

BACKGROUND

The present disclosure herein relates to semiconductor devices and methods of manufacturing the same and, more particularly, to non-volatile memory devices and methods of manufacturing the same.

Semiconductor devices are widely used in the electronics industry, in part because of their small size, functionality, and/or low manufacturing costs. Semiconductor devices can be categorized, for example, as semiconductor memory devices that store data, semiconductor logic devices that process data, and hybrid semiconductor devices having both the function of semiconductor memory devices and the function of semiconductor logic devices.

As the electronics industry has advanced, the required level for the performance characteristics of semiconductor devices has increased. For example, the requirement for semiconductor devices of high speed may be increasing, and/or the requirement for high reliability of semiconductor devices may be increasing. However, patterns in semiconductor devices may be increasingly made smaller (finer) due to the trend of increasing the integration density of semiconductor devices. Decreasing the pattern size (line width) of semiconductor devices has made it more and more difficult to realize semiconductor devices having high operating speeds and/or excellent reliability.

SUMMARY

Embodiments of the inventive concept may provide non-volatile memory devices with excellent reliability, and methods of fabricating the same.

Embodiments of the inventive concept may also provide non-volatile memory devices capable of high integration density, and methods of fabricating the same.

Embodiments of the inventive concept may also provide non-volatile memory devices capable of high speed operation, and methods of fabricating the same.

According to some embodiments of the inventive concepts, a non-volatile memory device includes a base gate, a metal gate, and a hard mask pattern sequentially stacked on a semiconductor layer. A width of the metal gate and a width of an upper portion of the base gate are less than a width of the hard mask pattern. The device further includes a first protection spacer disposed on a first sidewall of the metal gate and on a first sidewall of the upper portion of the base gate and a second protection spacer disposed on a second sidewall of the metal gate and on a second sidewall of the upper portion of the base gate. A tunnel dielectric layer, a charge storage layer and a blocking dielectric layer are sequentially stacked between the semiconductor layer and the base gate.

In some embodiments, the first and second protection spacers may not cover both opposing sidewalls of the hard mask pattern.

In other embodiments, wherein the first and second protection spacers may not cover both opposing sidewalls of a lower portion of the base gate.

In still other embodiments, the device may further include a barrier pattern disposed between the metal gate and the base gate. The first and second protection spacers may cover both opposing sidewalls of the barrier pattern, respectively In yet other embodiments, a width of the barrier pattern may be less than the width of the hard mask pattern.

In yet still other embodiments, a first undercut region may be defined beside the first sidewalls of the metal gate and the upper portion of the base gate, and a second undercut region may be defined beside the second sidewalls of the metal gate and the upper portion of the base gate. The first and second protection spacers may be disposed in the first and second undercut regions, respectively.

According to some further embodiments of the inventive concepts, a method of manufacturing a non-volatile memory device includes sequentially forming a conductive layer and a metal layer on a semiconductor layer; forming a hard mask pattern on the metal layer; etching the metal layer using the hard mask pattern as an etching mask to form a preliminary metal gate; laterally etching both sidewalls of the preliminary metal gate to form a metal gate; etching an upper portion of the conductive layer using the hard mask pattern and the metal gate as etching masks to form a protruding portion under the metal gate and to form undercut regions at both sides of the metal gate and the protruding portion; forming a protection layer on the semiconductor layer having the undercut regions; and successively etching the protection layer and a lower portion of the conductive layer using the hard mask pattern as an etching mask to form first and second protection spacers covering both sidewalls of the metal gate and the protruding portion and to form a base gate including the protruding portion.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
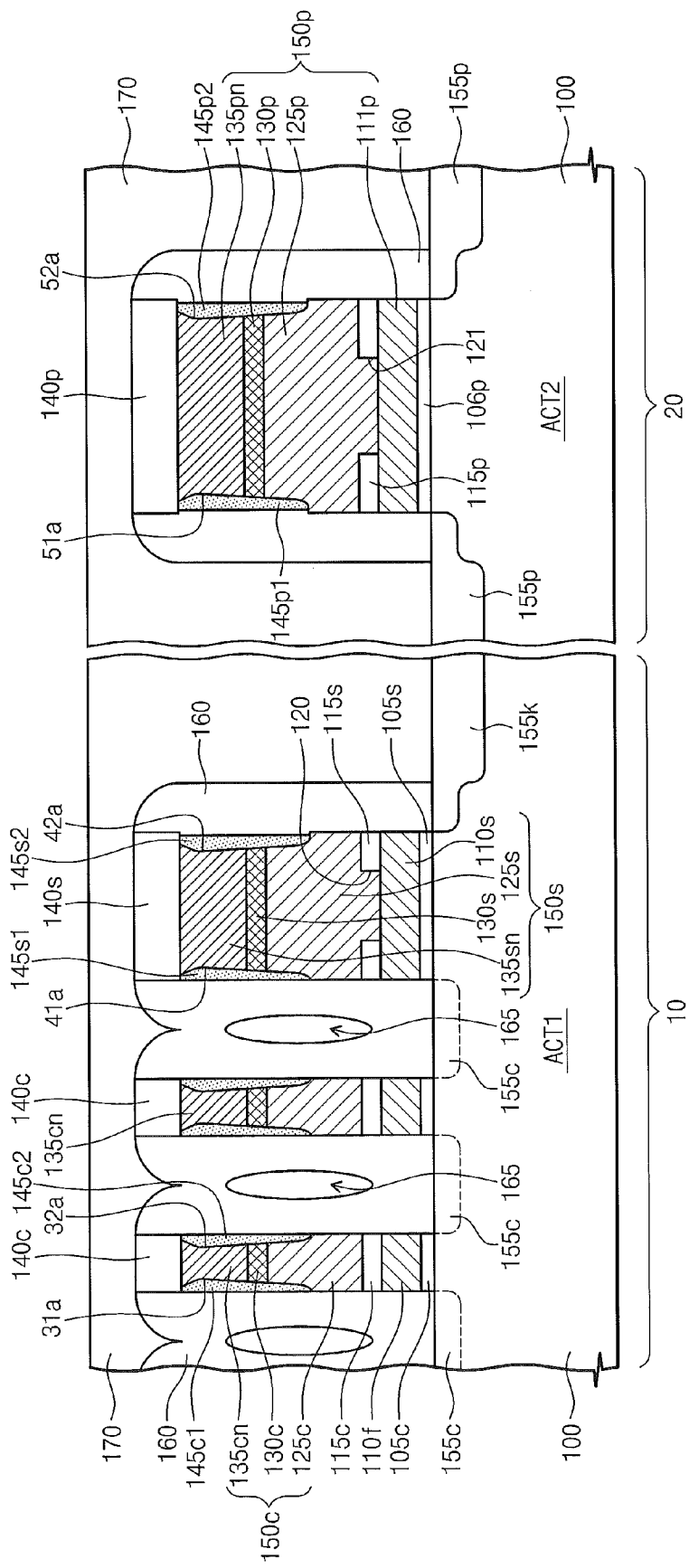
FIG. 1 is a cross sectional view illustrating a non-volatile memory device according to some embodiments of the inventive concept.

The inventive concepts will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 2A:
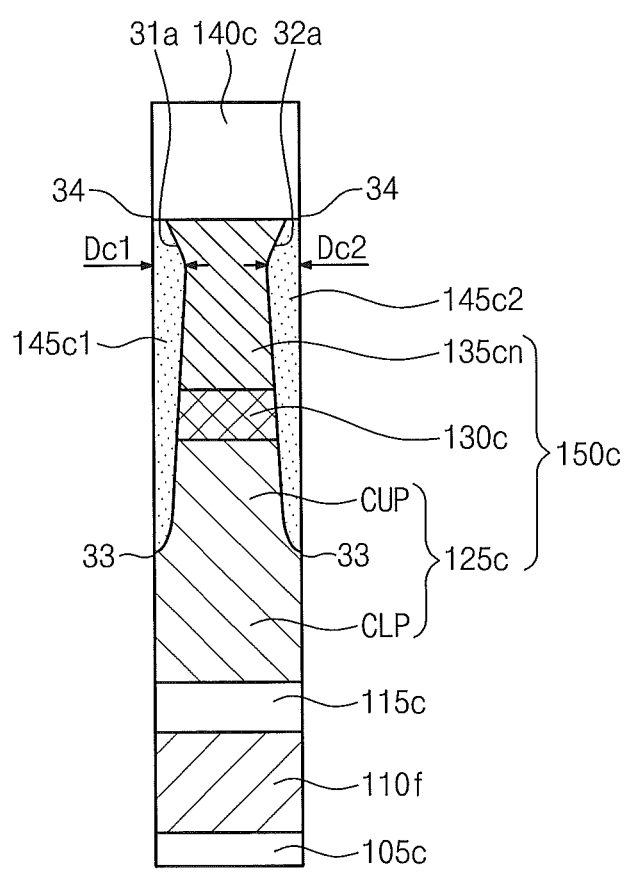
FIG. 2A is an enlarged view of a cell gate pattern of FIG. 1.
Figure 2B:
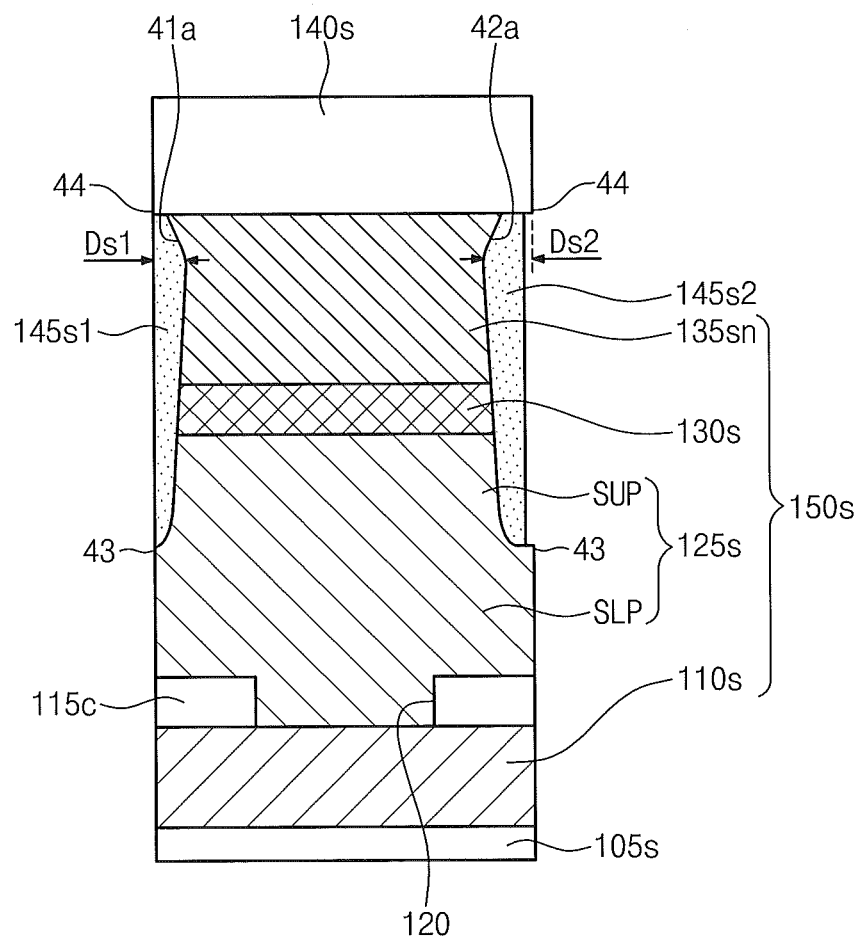
FIG. 2B is an enlarged view of a selection gate pattern of FIG. 1.
Figure 2C:
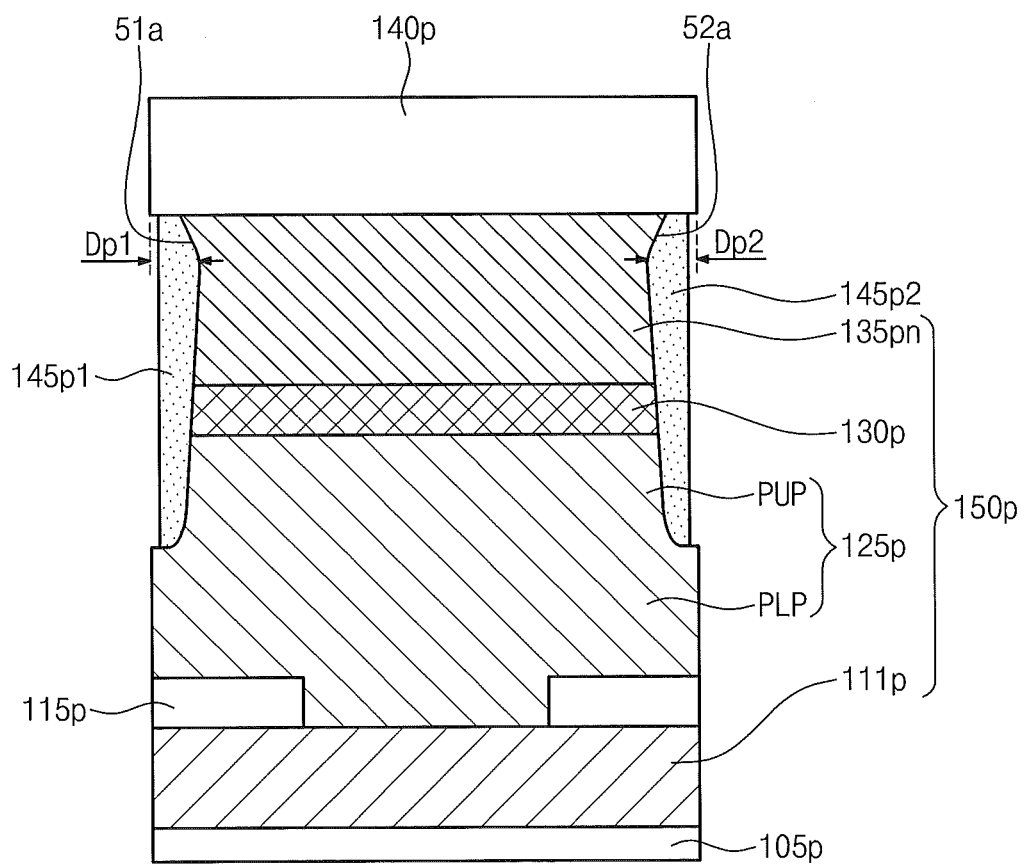
FIG. 2C is an enlarged view of a peripheral gate pattern of FIG. 1.

FIG. 1 is a cross sectional view illustrating a non-volatile memory device according to an embodiment of the inventive concept. FIG. 2A is an enlarged view of a cell gate pattern of FIG. 1, FIG. 2B is an enlarged view of a selection gate pattern of FIG. 1, and FIG. 2C is an enlarged view of a peripheral gate pattern of FIG. 1.

Referring to FIG. 1, A semiconductor substrate 100 (hereinafter, referred to as 'a substrate') may include a first region 10 and a second region 20. A device isolation pattern (not shown) may be disposed on the substrate 100 to define active portions ACT1 and ACT2. The first region 10 may be a cell array region, and the second region 20 may be a peripheral circuit region. In some embodiments, the first region 10 may be a NAND type cell array region. A first active portion ACT1 may be defined in the first region 10, and a second active portion ACT2 may be defined in the second region 20. The first and second active portions ACT1 and ACT2 may correspond to portions of the substrate 100 surrounded by the device isolation pattern, respectively. The first active portion ACT1 may be doped with dopants of a first conductivity type. The second active portion ACT2 may be doped with dopants of the same type as that of the first active portion ACT1. Alternatively, the second active portion ACT2 may be doped with dopants of a different type from that of the first active portion ACT1. That is, the second active portion ACT2 may be doped with dopants of a second conductivity type.

Cell gate patterns may be disposed in parallel on the first active portion ACT1 of the first region 10. Each of the cell gate patterns may include a tunnel dielectric layer 105c, a charge storage layer 110f, a blocking dielectric layer 115c, a control gate electrode 150c, and a control hard mask pattern 140c which are sequentially stacked. The control gate electrode 150c may include a control base gate 125c, a control barrier pattern 130c, and a control metal gate 135cn which are sequentially stacked.

A selection gate pattern may be disposed on the first active portion ACT1 at a side of the cell gate patterns. The selection gate pattern may include a selection gate dielectric layer 105s, a selection gate electrode 150s, and a selection hard mask pattern 140s which are sequentially stacked. The selection gate electrode 150s may include a selection bottom gate 110s, a selection sub-gate 125s, a selection barrier pattern 130s, and a selection metal gate 135sn which are sequentially stacked. The selection gate pattern may correspond to a ground selection gate pattern or a string selection gate pattern. In some embodiments, a distance between the cell gate patterns adjacent to each other may be substantially the same as a distance between the selection gate pattern and the cell gate pattern nearest to the selection gate pattern.

A peripheral gate pattern may be disposed on the second active portion ACT2 in the second region 20. The peripheral gate pattern may include a peripheral gate dielectric layer 106p, a peripheral gate electrode 150p and a peripheral hard mask pattern 140p which are sequentially stacked. The peripheral gate electrode 150p may include a peripheral bottom gate 111p, a peripheral sub-gate 125p, a peripheral barrier pattern 130p, and a peripheral metal gate 135pn which are sequentially stacked.

The cell, selection and peripheral gate patterns will be hereinafter described with reference to Figures in more detail. First, each of the cell gate patterns will be described with reference to FIG. 2A.

Referring to FIGS. 1 and 2A, a width of the control metal gate 135cn in the control gate electrode 150c is less than that of the control hard mask pattern 140c. Also, a width of an upper portion CUP of the control base gate 125c is less than that of the control hard mask pattern 140c. Additionally, a width of the control barrier pattern 130c disposed between the control metal gate 135cn and the upper portion CUP of the control base gate 125c may be less than that of the control hard mask pattern 140c and/or may be less than the width of a lower portion CLP of the control base gate 125c. Thus, a first control undercut region 31a may be defined beside first sidewalls of the control metal gate 135cn, the control barrier pattern 130c, and the upper portion CUP of the control base gate 125c. A second control undercut region 32a may be defined beside second sidewalls of the control metal gate 135cn, the control barrier pattern 130c, and the upper portion CUP of the control base gate 125c.

The first sidewalls of the control metal gate 135cn, the control barrier pattern 130c, and the upper portion CUP of the control base gate 125c may be aligned to each other and may constitute an inner sidewall of the first control undercut region 31a. Similarly, the second sidewalls of the control metal gate 135cn, the control barrier pattern 130c, and the upper portion CUP of the control base gate 125c may be aligned to each other and may constitute an inner sidewall of the second control undercut region 32a. The first and second sidewalls of the control metal gate 135cn are opposite to each other, the first and second sidewalls of the control barrier pattern 130c are opposite to each other, and the first and second sidewalls of the upper portion CUP of the control base gate 125c are opposite to each other.

The first and second control undercut regions 31a and 32a may be defined under both edge portions of the control hard mask pattern 140c, respectively. The width of the lower portion CLP of the control base gate 125c may be equal to or greater than that of the control hard mask pattern 140c. Thus, the first and second control undercut regions 31a and 32a may be disposed on both edge portions 33 of the lower portion CLP of the control base gate 125c, respectively. In other words, the first and second control undercut regions 31a and 32a may be disposed between the both edge portions 34 of the control hard mask pattern 140c and the both edge portions 33 of the lower portion CLP of the control base gate 125c, respectively.

The control metal gate 135cn may have a portion having a reduced width. In some embodiments, the portion having the reduced width of the control metal gate 135cn (hereinafter, referred to as 'a reduced width-portion of the control metal gate 135cn') may be disposed between a top surface and a bottom surface of the control metal gate 135cn. That is, widths of the top and bottom surfaces of the control metal gate 135cn may be greater than the reduced width of the control metal gate 135cn. In some embodiments, the reduced width-portion of the control metal gate 135cn may be relatively nearer to the top surface of the control metal gate 135cn than to the bottom surface thereof.

A lateral depth of the inner sidewall of the first control undercut region 31a with respect to a first sidewall of the control hard mask pattern 140c is defined as a first horizontal depth of the first control undercut region 31a. Due to at least a shape of the control metal gate 135cn, the first control undercut region 31a may have a first increased horizontal depth Dc1. In some embodiments, a first sidewall of the reduced width-portion of the control metal gate 135cn may be correspond to a portion of the inner sidewall of the first control undercut region 31a having the first increased horizontal depth Dc1.

Similarly, a lateral depth of the inner sidewall of the second control undercut region 32a with respect to a second sidewall of the control hard mask pattern 140c is defined as a second horizontal depth of the second control undercut region 32a. Due to at least a shape of the control metal gate 135cn, the second control undercut region 32a may have a second increased horizontal depth Dc2. In some embodiments, a second sidewall of the reduced width-portion of the control metal gate 135cn may be correspond to a portion of the inner sidewall of the second control undercut region 32a having the second increased horizontal depth Dc2.

In some embodiments, the first increased horizontal depth Dc1 of the first control undercut region 31a may be substantially the same as the second increased horizontal depth Dc2 of the second control undercut region 32a.

A first control protection spacer 145c1 is disposed on the first sidewalls of the control metal gate 135cn, the control barrier pattern 130c, and the upper portion CUP of the control base gate 125c. Thus, the first control protection spacer 145c1 covers one end of an interface of the control metal gate 135cn and the control barrier pattern 130c, and one end of an interface of the control barrier pattern 130c and the upper portion CUP of the control base gate 125c. A second control protection spacer 145c2 is disposed on the second sidewalls of the control metal gate 135cn, the control barrier pattern 130c, and the upper portion CUP of the control base gate 125c. Thus, the second control protection spacer 145c2 covers another end of the interface of the control metal gate 135cn and the control barrier pattern 130c, and another end of the interface of the control barrier pattern 130c and the upper portion CUP of the control base gate 125c.

As illustrated in FIGS. 1 and 2A, the first and second control protection spacers 145c1 and 145c2 may not cover both sidewalls of the lower portion CLP of the control base gate 125c. Also, the first and second control protection spacers 145c1 and 145c2 may not cover both sidewalls of the control hard mask pattern 140c. In some embodiments, top ends of the first and second control protection spacers 145c1 and 145c2 may be in contact with bottom surfaces of the both edge portions 34 of the control hard mask pattern 140c, respectively. Also, bottom ends of the first and second control protection spacers 145c1 and 145c2 may be in contact with top ends of the both edge portions 33 of the lower portion CLP of the control base gate 125c, respectively. In some embodiments, the first and second control protection spacers 145c1 and 145c2 may be disposed in the first and second control undercut regions 31a and 32a, respectively.

The control base gate 125c may include a semiconductor doped with dopants. For example, the control base gate 125c may include silicon doped with p-type or n-type dopants. In some embodiments, the control base gate 125c may be further doped with carbon. That is, the control base gate 125c may include a semiconductor doped with dopants and carbon. The control metal gate 135cn may include metal having resistivity lower than that of the control base gate 125c. For example, the control metal gate 135cn may include tungsten, copper, aluminum, etc. The control barrier pattern 130c may include a conductive material which substantially impedes the diffusion of metal from the control metal gate 135c into the control base gate 125c. For example, the control base pattern 130c may include a conductive metal nitride (e.g. tungsten nitride, tantalum nitride and/or titanium nitride).

The first and second control protection spacers 145c1 and 145c2 may include a material having excellent oxidation-resistance. In some embodiments, the first and second control protection spacers 145c1 and 145c2 may include a nitride based material. In some embodiments, first and second control protection spacers 145c1 and 145c2 may be substantially free of metal. For example, the first and second control protection spacers 145c1 and 145c2 may include silicon nitride and/or silicon oxynitride.

The tunnel dielectric layer 105c may include an oxide (e.g. silicon oxide) and/or an oxynitride (e.g. silicon oxynitride). The blocking dielectric layer 115c may include an oxide/nitride/oxide (ONO) dielectric stack. Alternatively, the blocking dielectric layer 115c may include a high-k dielectric material having a dielectric constant higher than that of the tunnel dielectric layer 105c. For example, the high-k dielectric material may include an insulating metal oxide such as aluminum oxide, and/or hafnium oxide, etc. The blocking dielectric layer 115c may include the high-k dielectric material and a barrier dielectric material. The barrier dielectric material may include a dielectric material having an energy band gap greater than that of the high-k dielectric material. For example, the barrier dielectric material may include silicon oxide. The charge storage layer 110f may include a semiconductor material (e.g. silicon). In this case, the charge storage layer 110f may correspond to a floating gate. In some embodiments, the charge storage layer 110f may be formed of a semiconductor doped with p-type and/or n-type dopants (dopants of the first conductivity type or the second conductivity type), a semiconductor doped with carbon and p-type and/or n-type dopants (dopants of the first conductivity type or the second conductivity type), or a semiconductor doped with carbon. The control hard mask pattern 140c may include an insulating material which impedes the diffusion of metal atoms from the control metal gate 135cn. The control hard mask pattern 140c may include an insulating nitride (e.g. silicon nitride, etc).

The first and second control protection spacers 145c1 and 145c2 protect the both sidewalls of the control metal gate 135cn and the both sidewalls of the control barrier pattern 130c. Also, since the first and second control protection spacers 145c1 and 145c2 are disposed on the both sidewalls of the upper portion CUP of the control base gate 125c, first and second control protection spacers 145c1 and 145c2 cover the interface of the control metal gate 135cn and the control barrier pattern 130c and the interface of the control barrier pattern 130c and the upper portion CUP of the control base gate 125c. Thus, oxidation of the control metal gate 135cn and the control barrier pattern 130c, which may be caused through an oxidation process, may be reduced or impeded by the first and second control protection spacers 145c1 and 145c2. Also, the first and second control protection spacers 145c1 and 145c2 can protect the control metal gate 135cn and the control barrier pattern 130c from a subsequent cleaning process. Thus, contamination caused by metal atoms in the control metal gate 135cn and/or the control barrier pattern 130c may be reduced. As a result, a non-volatile memory device with excellent reliability may be realized.

Also, since the width of the control metal gate 135cn, the control barrier pattern 130c, and the upper portion CUP of the control base gate 125c may be less than that of the control hard mask pattern 140c, the first and second undercut regions 31a and 32a may be defined. Thus, the first and second control protection spacers 145c1 and 145c2 may not cover the both sidewalls of the control hard mask pattern 140c. Also, the first and second control protection spacers 145c1 and 145c2 may not cover both sidewalls of the lower portion CLP of the control base gate 125c. As a result, the control protection spacers 145c1 and 145c2 may not substantially increase the width of the cell gate pattern. Thus, a non-volatile memory that is capable of high integration density may be realized.

Additionally, since the cell gate electrode 150c includes the control metal gate 135cn having low resistivity, the non-volatile memory device optimized for high speed may be realized.

Next, the selection gate pattern will be described with reference to FIG. 2B in more detail.

Referring to FIGS. 1 and 2B, a width of the selection metal gate 135sn in the selection gate electrode 150s may be less than that of the selection hard mask pattern 140s. Also, a width of an upper portion SUP of the selection sub-gate 125s and a width of the selection barrier pattern 130s may be less than that of the selection hard mask pattern 140s. Thus, a first selection undercut region 41a may be defined beside first sidewalls of the selection metal gate 135sn, the selection barrier pattern 130s, and the upper portion SUP of the selection sub-gate 125s. Also, a second selection undercut region 42a may be defined beside second sidewalls of the selection metal gate 135sn, the selection barrier pattern 130s, and the upper portion SUP of the selection sub-gate 125s.

The first sidewalls of the selection metal gate 135sn, the selection barrier pattern 130s, and the upper portion SUP of the selection sub-gate 125s may constitute an inner sidewall of the first selection undercut region 41a. The second sidewalls of the selection metal gate 135sn, the selection barrier pattern 130s, and the upper portion SUP of the selection sub-gate 125s may constitute an inner sidewall of the second selection undercut region 42a. The first and second selection undercut regions 41a and 42a may be disposed under both edge portions 44 of the selection hard mask pattern 140s, respectively. A width of lower portion SLP of the selection sub-gate 125s may be equal to or greater than that of the selection hard mask pattern 140s. Thus, the first and second selection undercut regions 41a and 42a may be disposed on both edge portions 43 of the lower portion SLP of the selection sub-gate 125s, respectively.

The selection metal gate 135sn may include a portion having a reduced width (hereinafter, referred to as 'a reduced width-portion of the selection metal gate 135sn'), like the control metal gate 135cn. In some embodiments, the reduced width-portion of the selection metal gate 135sn may be disposed between a top surface and a bottom surface of the selection metal gate 135sn. In some embodiments, the reduced width-portion of the selection metal gate 135sn may be relatively near to the top surface of the selection metal gate 135sn than the bottom surface thereof.

Due to at least a shape of the selection metal gate 135sn, the first selection undercut region 41a may have a first increased horizontal depth Ds1, and the second selection undercut region 42a may have a second increased horizontal depth Ds2. In some embodiments, both sidewalls of the reduced width-portion of the selection metal gate 135sn may correspond to portions of the inner sidewalls of the first and second selection undercut regions 41a and 42a, which have the first and second increased horizontal depths Ds1 and Ds2, respectively.

In some embodiments, the first increased horizontal depth Ds1 of the first selection undercut region 41a may be different from the second increased horizontal depth Ds2 of the second selection undercut region 42a. For example, when the first selection undercut region 41a is disposed adjacent to the cell gate pattern and the second selection undercut region 42a is disposed opposite to the first selection undercut region 41a (that is, the first selection undercut region 41a is disposed between the cell gate pattern and the second selection undercut region 42a), the second increased horizontal depth Ds2 of the second selection undercut region 42a may be greater than the first increased horizontal depth Ds1 of the first selection undercut region 41a. This may be because a distance between the first selection undercut region 41a and a pattern (e.g. the cell gate pattern) adjacent to the first selection undercut region 41a may be greater than a distance between the second selection undercut region 42a and a pattern (not shown, e.g. another selection gate pattern) adjacent to the second selection undercut region 42a.

In some embodiments, the second increased horizontal depth Ds2 of the second selection undercut region 42a may be greater than the first and second increased horizontal depths Dc1 and Dc2 of the first and second control undercut regions 31a and 32a (FIG. 2A). For example, the second increased horizontal depth Ds2 of the second selection undercut region 42a may be about 1.1 times to about 10 times of the first increased horizontal depth Dc1 of the first control undercut region 31a (or the second increased horizontal depth Dc2 of the second control undercut region 32a). However, the inventive concept is not limited thereto.

In some embodiments, the first increased horizontal depth Ds1 of the first selection undercut region 41a may be substantially the same as each of the first and second increased horizontal depths Dc1 and Dc2 of the control undercut regions 31a and 32a.

A first selection protection spacer 145s1 is disposed on the first sidewalls of the selection metal gate 135sn, the selection barrier pattern 130s and the upper portion SUP of the selection sub-gate 125s. A second selection protection spacer 145s2 is disposed on the second sidewalls of the selection metal gate 135sn, the selection barrier pattern 130s and the upper portion SUP of the selection sub-gate 125s. Thus, the first and second selection protection spacers 145s1 and 145s2 cover both ends of an interface of the selection metal gate 135sn and the selection barrier pattern 130s, and both ends of an interface of the selection barrier pattern 130s and the upper portion SUP of the selection sub-gate 125s.

The first and second selection protection spacers 145s1 and 145s2 may not cover both sidewalls of a lower portion SLP of the selection sub-gate 125s. Also, the first and second selection protection spacers 145s1 and 145s2 may not cover both sidewalls of the selection hard mask pattern 140s. In some embodiments, the first and second selection protection spacers 145s1 and 145s2 may be disposed in the first and second selection undercut regions 41a and 42a, respectively.

A thickness of the first selection protection spacer 145s1 based on the inner sidewall of the first selection undercut region 41a may be different from a thickness of the second selection protection spacer 145s2 based on the inner sidewall of the second selection undercut region 42a. In some embodiments, the thickness of the second selection protection spacer 145s2 may be greater than the thickness of the first selection protection spacer 145s1. In some embodiments, the thickness of the second selection protection spacer 145s2 may be greater than each of thicknesses of the first and second control protection spacers 145c1 and 145c2.

The selection sub-gate 125s, the selection barrier pattern 130s, the selection metal gate 135sn, and the selection hard mask pattern 140s may be formed of the same materials as those of the control base gate 125c, the control barrier pattern 130c, the control metal gate 135cn, and the control hard mask pattern 140c, respectively. The selection bottom gate 110s may be formed of the same material as that of the charge storage layer 110f. The selection gate dielectric layer 105s may be formed of the same material as that of the tunnel dielectric layer 105c.

The first and second selection protection spacers 145s1 and 145s2 may be formed of the same material as those of the first and second control protection spacers 145c1 and 145c2.

In some embodiments, a selection interlayer pattern 115s may be disposed between the selection bottom gate 110s and the selection sub-gate 125s. In this case, the selection sub-gate 125s may be connected to the selection bottom gate 110s through a selection opening 120 penetrating the selection interlayer pattern 115s. The selection interlayer pattern 115s may be formed of the same material as that of the blocking dielectric layer 115c.

Like the first and second control protection spacers 145c1 and 145c2, the first and second selection protection spacers 145s1 and 145s2 protect the both sidewalls of the selection metal gate 135sn, the both sidewalls of the selection barrier pattern 130s, the interface of the selection metal gate 135sn and the selection barrier pattern 130s, and the interface of the selection barrier pattern 130s and the upper portion SUP of the selection sub-gate 125s. Thus, oxidization of the selection metal gate 135sn and/or the selection barrier pattern 130s by an oxidation process may be impeded, and contamination by metal atoms in the selection metal gate 135sn and/or the selection barrier pattern 130s may be reduced.

Also, since at least widths of the selection metal gate 135sn and the upper portion SUP of the selection sub-gate 125s may be less than that of the selection hard mask pattern 140s, the first and second selection protection spacers 145s1 and 145s2 may not substantially increase the width of the selection gate pattern. Also, since the selection gate electrode 150s includes the selection metal gate 135sn having a low resistivity, an operating speed of a selection transistor including the selection gate electrode 150s may be improved.

Additionally, the horizontal depth of the second selection undercut region 42a may be greater than that of the first selection undercut region 41a. Thus, although one edge portion of the selection hard mask pattern 140s disposed on the second selection undercut region 42a may be damaged by a loading effect which may be caused during formation of the spacer, the selection metal gate 135sn may be protected.

The peripheral gate pattern in the second region 20 will be described with reference to FIG. 2C in more detail.

Referring to FIGS. 1 and 2C, a width of the peripheral metal gate 135pn and a width of an upper portion PUP of the peripheral sub-gate 125p in the peripheral gate electrode 150p may be less than that of the peripheral hard mask pattern 140p. Also, a width of the peripheral barrier pattern 130p may be less than that of the peripheral hard mask pattern 140p. Thus, a first peripheral undercut region 51a may be defined beside first sidewalls of the peripheral metal gate 135pn, the peripheral barrier pattern 130p, and the upper portion PUP of the peripheral sub-gate 125p. Also, a second peripheral undercut region 52a may be defined beside second sidewalls of the peripheral metal gate 135pn, the peripheral barrier pattern 130p, and the upper portion PUP of the peripheral sub-gate 125p.

An inner sidewall of the first peripheral undercut region 51a may include the first sidewalls of the peripheral metal gate 135pn, the peripheral barrier pattern 130p, and the upper portion PUP of the peripheral sub-gate 125p. And an inner sidewall of the second peripheral undercut region 52 may include the second sidewalls of the peripheral metal gate 135pn, the peripheral barrier pattern 130p, and the upper portion PUP of the peripheral sub-gate 125p. The first and second peripheral undercut regions 51a and 52a may be disposed under both edge portions of the peripheral hard mask pattern 140p, respectively. Also, the first and second peripheral undercut regions 51a and 52a may be disposed on both edge portions of a lower portion PLP of the peripheral sub-gate 125p, respectively.

The peripheral metal gate 135pn may include a portion having a reduced width (hereinafter, referred to as 'a reduced width-portion of the peripheral metal gate 135pn'). In some embodiments, the reduced width-portion of the peripheral metal gate 135pn may be disposed between a top surface and a bottom surface of the peripheral metal gate 135pn. Due to at least a shape of the peripheral metal gate 135pn, the first and second peripheral undercut regions 51a and 52a may have first and second increased horizontal depths Dp1 and Dp2, respectively.

In some embodiments, the first increased horizontal depth Dp1 of the first peripheral undercut region 51a may be substantially the same as the second increased horizontal depth Dp2 of the second peripheral undercut region 52a. In some embodiments, each of the first and second increased horizontal depths Dp1 and Dp2 of the first and second peripheral undercut regions 51a and 52a may be greater than each of the first and second increased horizontal depths Dc1 and Dc2 of the first and second control undercut regions 31a and 32a. In some embodiments, each of the first and second increased horizontal depths Dp1 and Dp2 of the first and second peripheral undercut regions 51a and 52a may be greater than the first increased horizontal depth Ds1 of the first selection undercut region 41a. In some embodiments, each of the first and second increased horizontal depths Dp1 and Dp2 of the first and second peripheral undercut regions 51a and 52a may be substantially the same as the second increased horizontal depth Ds2 of the second selection undercut region 42a.

The peripheral sub-gate 125p, the peripheral barrier pattern 130p, the peripheral metal gate 135pn, and the peripheral hard mask pattern 140p may be formed of the same materials as those of the control base gate 125c, the control barrier pattern 130c, the control metal gate 135cn, and the control hard mask pattern 140c, respectively. The peripheral bottom gate 111p may include a semiconductor doped with n-type and/or p-type dopants, or a semiconductor with n-type and/or p-type dopants and carbon. In some embodiments, when the charge storage layer 110f is doped with dopants, the peripheral bottom gate 111p may be doped with dopants of the same conductivity type as the charge storage layer 110f, or be doped with dopants of a different conductivity type from the charge storage layer 110f. The peripheral gate dielectric layer 105p may be formed of the same material as that of the selection gate dielectric layer 105s, however, the inventive concept is not limited thereto.

A first peripheral protection spacer 145p1 may be disposed on the first sidewalls of the peripheral metal gate 135pn, the peripheral barrier pattern 130p, and the upper portion PUP of the peripheral sub-gate 125p, and a second peripheral protection spacer 145p2 may be disposed on the second sidewalls of the peripheral metal gate 135pn, the peripheral barrier pattern 130p, and the upper portion PUP of the peripheral sub-gate 125p. Due to the first and second peripheral protection spacers 145p1 and 145p2, oxidization of the peripheral metal gate 135pn and the peripheral barrier pattern 130p by an oxidation process may be reduced or avoided, and contamination by metal atoms in the peripheral metal gate 135pn and/or the peripheral barrier pattern 130p may be reduced.

The first and second peripheral protection spacers 145p1 and 145p2 may be formed of the same material as those of the first and second control protection spacers 145c1 and 145c2.

The first and second peripheral protection spacers 145p1 and 145p2 may not cover both sidewalls of the lower portion PLP of the peripheral sub-gate 125p. Also, the first and second peripheral protection spacers 145p1 and 145p2 may not cover both sidewalls of the peripheral hard mask pattern 140p. In some embodiments, the first and second peripheral protection spacers 145p1 and 145p2 may be disposed in the first and second peripheral undercut regions 51a and 52a, respectively. Thus, the first and second peripheral protection spacers 145p1 and 145p2 may not increase the width of the peripheral gate pattern.

Each of the first and second peripheral protection spacers 145p1 and 145p2 may be thicker than each of the first and second control protection spacers 145c1 and 145c2 of the cell gate pattern. However, the inventive concept is not limited thereto.

In some embodiments, a peripheral interlayer pattern 115p may be disposed between the peripheral bottom gate 111p and the peripheral sub-gate 125p. In this case, the peripheral sub-gate 125p may be connected to the peripheral bottom gate 111p through a peripheral opening 121 penetrating the peripheral interlayer pattern 115p. The peripheral interlayer pattern 115p may be formed of the same material as that of the blocking dielectric layer 115c.

Referring to FIG. 1, cell source/drain regions 155c may be defined in the first active portion ACT1 at both sides of each of the cell gate patterns. A common doped region 155k may be disposed in the first active portion ACT1 at a side of the selection gate pattern. The selection gate pattern may be disposed the common doped region 155k and the cell gate patterns. When the selection gate pattern is the string selection gate pattern, the common doped region 155k may correspond to a common drain. Alternatively, when the selection gate pattern is the ground selection gate pattern, the common doped region 155k may correspond to a common source. The common doped region 155k may be doped with dopants of the second conductivity type. The common doped region 155k may have a lightly doped drain (LDD) structure. The cell source/drain region 155c may be doped with dopants of the second conductivity type. Alternatively, the cell source/drain region 155c may be an inversion layer generated by a fringe field. The fringe field may be generated from the control gate electrode 150c when an operating voltage is applied to the control gate electrode 150c.

Peripheral source/drain regions 155p may be disposed in the second active portion ACT2 at both sides of the peripheral gate pattern. The peripheral source/drain regions 155p may be doped with dopants of a different type from the second active portion ACT2. The peripheral source/drains 155p may have a LDD structure.

Gate spacers 160 may be disposed on both sidewalls of each of the cell gate patterns, both sidewalls of the selection gate pattern, and both sidewalls of the peripheral gate pattern. The gate spacers 160 may include an oxide (e.g. silicon oxide, etc), a nitride (e.g. silicon nitride) and/or an oxynitride (e.g. silicon oxynitride).

In some embodiments, an air gap 165 surrounded by the gate spacers 160 may be defined between the cell gate patterns adjacent to each other. Due to the air gap 165, parasitic capacitance between the cell gate patterns adjacent to each other may be reduced. Thus, a non-volatile memory device having high operation speed may be realized.

An interlayer dielectric layer 170 may be disposed on an entire surface of the substrate 100. The interlayer dielectric layer 170 may include an oxide (e.g. silicon oxide, etc), a nitride (e.g. silicon nitride) and/or an oxynitride (e.g. silicon oxynitride). When the common doped region 155k is the common source, a common source line (not shown) may penetrate the interlayer dielectric layer 170 to be connected to the common dope region 155k. Alternatively, when the common doped region 155k is the common drain, a contact plug (not shown) may penetrate the interlayer dielectric layer 170 to be connected to the common doped region 155k, and a bit line (not shown) may be disposed on the interlayer dielectric layer 170 in the first region 10 to be connected to the contact plug.

According to the above non-volatile memory device, the metal gates 135cn, 135sn, and 135pn and the barrier patterns 130c, 130s, and 130p can be protected by the protection spacers 145c1, 145c2, 145s1, 145s2, 145p1, and 145p2. In particular, since the protection spacers 145c1, 145c2, 145s1, 145s2, 145p1, and 145p2 cover both sidewalls of the upper portions CUP, SUP, and PUP, the bottom surfaces of the metal gates 135cn, 135sn, and 135pn and the barrier patterns 130c, 130s, and 130p can be completely covered by the protection spacers 145c1, 145c2, 145s1, 145s2, 145p1, and 145p2. Thus, oxidization of the metal gates 135cn, 135sn, and 135pn and the barrier patterns 130c, 130s, 130p, and/or contamination caused by metal atoms in the metal gates 135cn, 135sn, and 135pn and the barrier patterns 130c, 130s, and 130p may be reduced or avoided. As a result, a non-volatile memory device having excellent reliability may be realized.

Also, the widths of the metal gates 135cn, 135sn, and 135pn and the widths of the upper portions CUP, SUP, and PUP may be less than those of the control, selection, and peripheral hard mask patterns 140c, 140s, and 140p, respectively. Thus, the protection spacers 145c1, 145c2, 145s1, 145s2, 145p1, and 145p2, may not substantially increase the width of the cell, selection and peripheral gate patterns. As a result, a non-volatile memory device capable of high integration density may be realized.

Additionally, since the cell, selection and peripheral gate patterns may include the metal gates 135cn, 135sn, and 135pn, a non-volatile memory device capable of operating at high speed may be realized.

As described above, the first region 10 may be a NAND type cell array region. However, the inventive concept is not limited thereto. Alternatively, the first region 10 may be a NOR type cell array region. In this case, the selection gate pattern may be omitted, and the cell source/drain regions 155c may be realized to be a LDD structure doped with dopants of the second conductivity type.

Meanwhile, as described above, the charge storage layer 110f of the cell gate pattern may be a floating gate. However, the inventive concept is not limited thereto. A charge storage layer according to embodiments of the inventive concept may have other shapes, an example of which is described with reference to FIG. 3.

Figure 3:
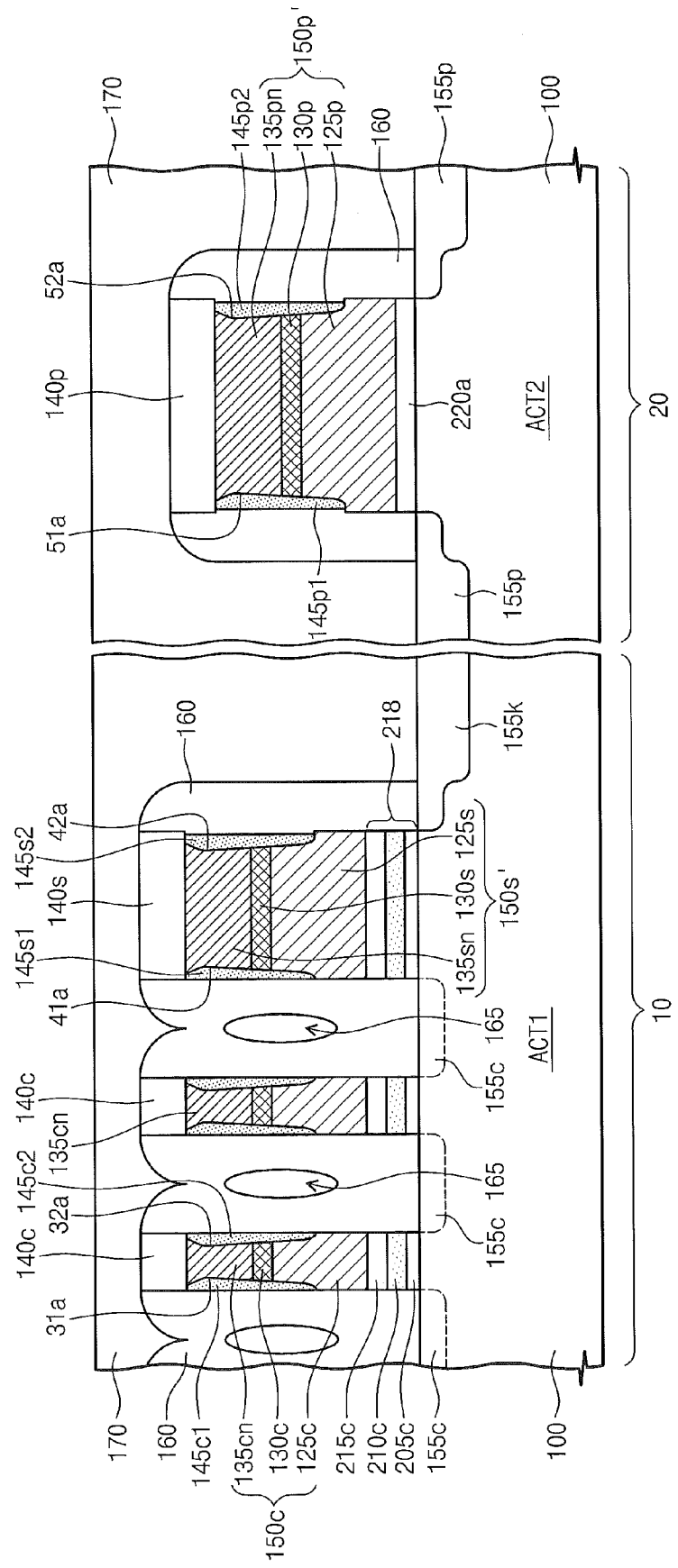
FIG. 3 is a cross sectional view illustrating a modified embodiment of a non-volatile memory device according to some embodiments of the inventive concept.

FIG. 3 is a cross sectional view illustrating a modified embodiment of a non-volatile memory device according to further embodiments of the inventive concept. In present modified embodiment, the same elements as described in the first embodiment will be indicated by the same reference numerals or the same reference designators. For the purpose of ease and convenience in explanation, the descriptions to the same elements as in the first embodiment will be omitted or mentioned briefly.

Referring to FIG. 3, a charge storage layer 210c may be disposed between the control gate electrode 150c and the first active portion ACT1, and a blocking dielectric layer 215c may be disposed between the control gate electrode 150c and the charge storage layer 210c. A tunnel dielectric layer 205c may be disposed between the charge storage layer 210c and the first active portion ACT1. The tunnel dielectric layer 205c may include an oxide (e.g. silicon oxide) and/or an oxynitride (e.g. silicon oxynitride). The charge storage layer 210c may include a dielectric material having traps that store charges. For example, the charge storage layer 210c may include silicon nitride, a silicon oxide including nano dots, and/or an insulating metal oxide (e.g., hafnium oxide, etc.), etc. The nano dots may include a semiconductor material and/or metal, etc. The blocking dielectric layer 215c may include a high-k material (e.g., an insulating metal oxide such as aluminum oxide and/or hafnium oxide, etc.) which has a higher dielectric constant than that of the tunnel dielectric layer 205c. Additionally, the blocking dielectric layer 215c may further include a barrier dielectric material (e.g., silicon oxide, etc.) having a greater band gap energy than that of the high-k material.

In some embodiments, as illustrated in FIG. 3, the charge storage layer 210c may be laterally spaced apart from a charge storage layer in a neighboring cell gate pattern. Alternatively, since the charge storage layer 210c includes the dielectric material having traps, the charge storage layer 210c may be laterally extended to be connected to a charge storage layer in a neighboring cell gate pattern.

Still referring to FIG. 3, a selection gate electrode 150s' may include the selection sub-gate 125s, the selection barrier pattern 130s and the selection metal gate 135sn which are sequentially stacked on a selection gate dielectric layer 218. The selection sub-gate 125s of the selection gate electrode 150s' may be disposed directly on the selection gate dielectric layer 218. That is, the selection gate electrode 150s' may not include the selection bottom gate 110s illustrated in FIGS. 1 and 2B. In some embodiments, the selection gate dielectric layer 218 may include a first layer, a second layer, and a third layer which are sequentially stacked. The first layer, the second layer, and the third layer of the selection gate dielectric layer 218 may include the same materials as the tunnel dielectric layer 205c, the charge storage layer 210c and the blocking dielectric layer 215c, respectively.

Like the selection gate electrode 150s', a peripheral gate electrode 150p' may include the peripheral sub-gate 125p, the peripheral barrier pattern 130p and the peripheral metal gate 135pn which are sequentially stacked on a peripheral gate dielectric layer 220. The peripheral sub-gate 125p of the peripheral gate electrode 150p' may be disposed directly on the peripheral gate dielectric layer 220. The peripheral gate dielectric layer 220 may include an oxide (e.g. silicon oxide). The peripheral gate dielectric layer 220 may have a different thickness from that of the tunnel dielectric layer 205c.

In some embodiments, the selection gate dielectric layer 218 may be formed of the same material and/or thickness as the peripheral gate dielectric layer 220.

FIGS. 4 to 11 are cross sectional views illustrating a method of manufacturing non-volatile memory devices according to embodiments of the inventive concept.

Figure 4:
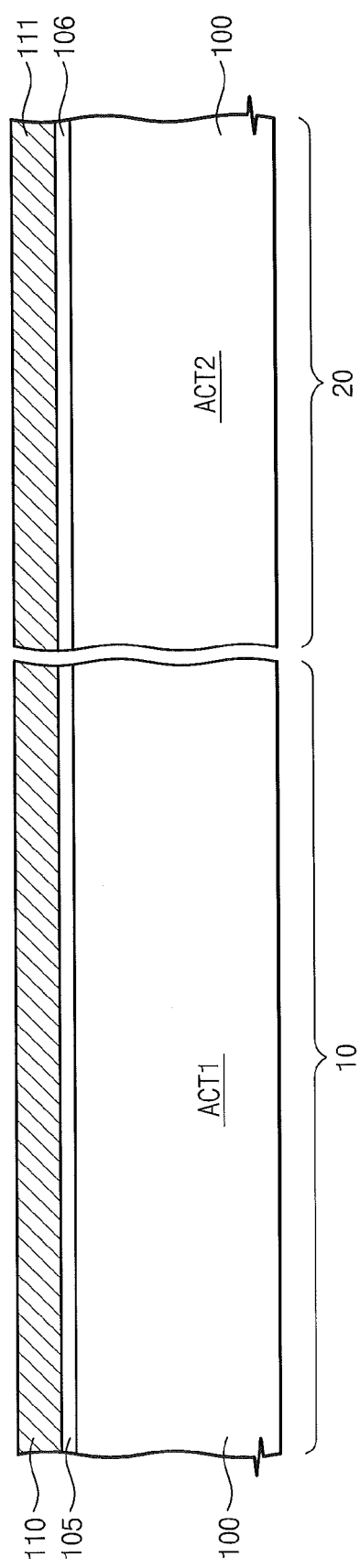
FIGS. 4 to 11 are cross sectional views illustrating methods of manufacturing non-volatile memory devices according to embodiments of the inventive concept.

Referring to FIG. 4, a substrate 100 including a first region 10 and a second region 20 may be prepared. A first active portion ACT1 and a second active portion ACT2 may be defined in the first region 10 and the second region 20, respectively. A tunnel dielectric layer 105 and a first semiconductor pattern 110 may be sequentially formed on the first active portion ACT1. A peripheral gate dielectric layer 106 and a second semiconductor pattern 111 may be sequentially formed on the second active portion ACT2. The first and second active portions ACT1 and ACT2 may be defined by a device isolation pattern (not shown). The first semiconductor pattern 110 may be formed to be self-aligned with the first active portion ACT1, and the second semiconductor pattern 111 may be formed to be self-aligned with the second active portions ACT2.

For example, the tunnel dielectric layer 105 may be formed on the substrate in the first region 10, and the peripheral gate dielectric layer 106 may be formed on the substrate in the second region 20. The peripheral gate dielectric layer 106 and the tunnel dielectric layer 105 may be formed simultaneously. Alternatively, the peripheral gate dielectric layer 106 and the tunnel dielectric layer 105 may be sequentially formed. Subsequently, a semiconductor layer and a hard mask layer may be sequentially formed on an entire surface of the substrate 100. The hard mask layer, the semiconductor layer, the dielectric layers 105 and 106, and the substrate 100 may be successively patterned to form a trench defining the first and second active portions ACT1 and ACT2, and the first and second semiconductor patterns 110 and 111. Subsequently, the device isolation pattern filling the trench may be formed. Thus, the first and second semiconductor patterns 110 and 111 may be self-aligned with the first and second active portions ACT1 and ACT2, respectively. Next, the patterned hard mask layer on the first and second semiconductor patterns 110 and 111 may be removed. The first and second semiconductor patterns 110 and 111 maybe doped as states of the charge storage layer 110f and the peripheral bottom gate 111p described above.

Figure 5:
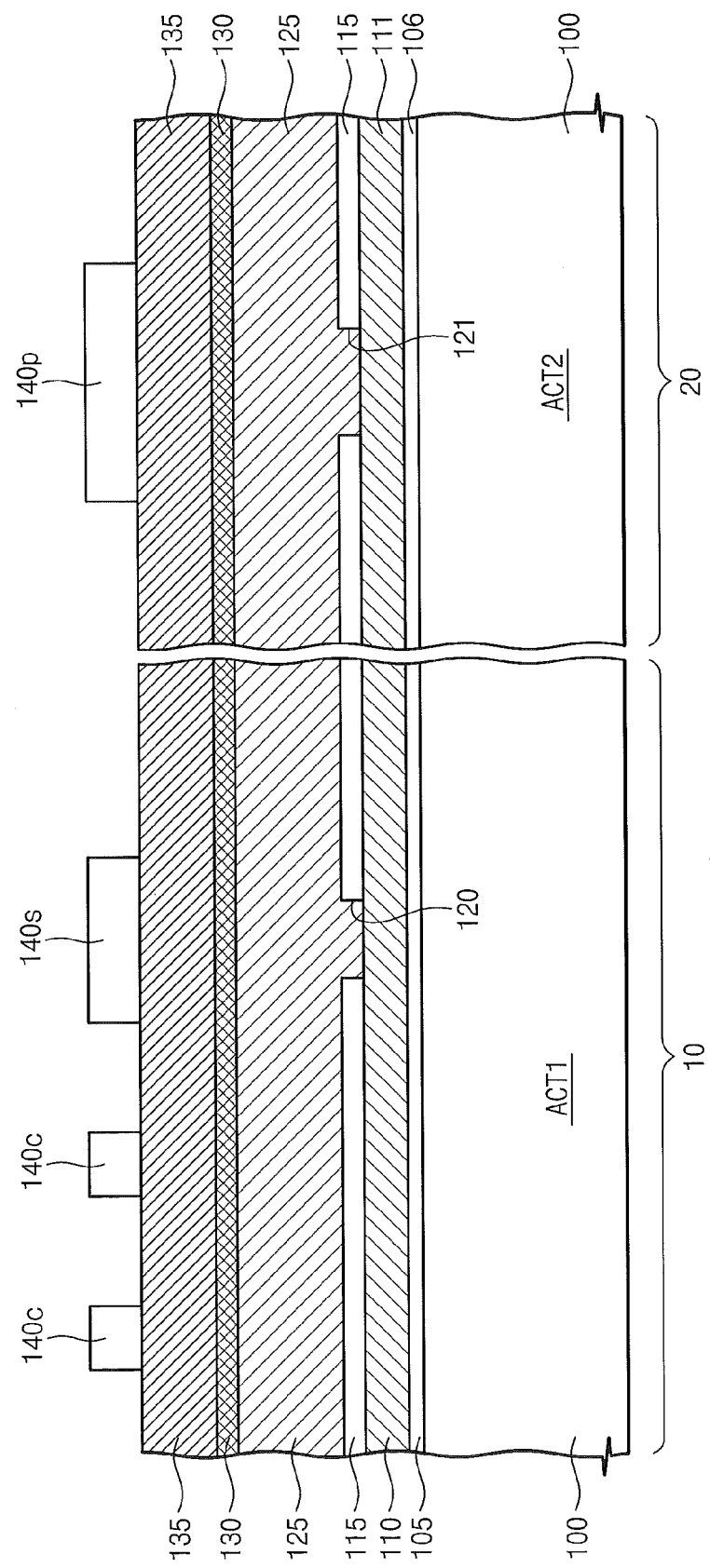

Referring to FIG. 5, a blocking dielectric layer 115 may be formed on the substrate 100 having the first and second semiconductor patterns 110 and 111. The blocking dielectric layer 115 may be patterned to form a selection opening 120 in the first region 10 and a peripheral opening 121 in the second region 20. Before the selection and peripheral openings 120 and 121 are formed, a protection semiconductor layer (not shown) may be formed on the blocking dielectric layer 115. In this case, each of the selection and peripheral openings 120 and 121 may penetrate the protection semiconductor layer and the blocking dielectric layer 115.

A conductive layer 125, a barrier layer 130, and a metal layer may be sequentially formed on the substrate 100 having the selection and peripheral openings 120 and 121. The conductive layer 125 may include a semiconductor material doped with dopants. The conductive layer 125 may be in contact with the first and second semiconductor patterns 110 and 111 through the selection and peripheral openings 120 and 121. The barrier layer 130 may be formed of a conductive material. For example, the barrier layer 130 may include a conductive metal nitride such as tungsten nitride, tantalum nitride, and/or titanium nitride.

Control hard mask patterns 140c and a selection hard mask pattern 140s may be formed on the metal layer 135 in the first region 10. A peripheral hard mask pattern 140p may be formed on the metal layer 135 in the second region 20. The control, selection, and peripheral hard mask patterns 140c, 140s, and 140p may be formed simultaneously.

Figure 6:
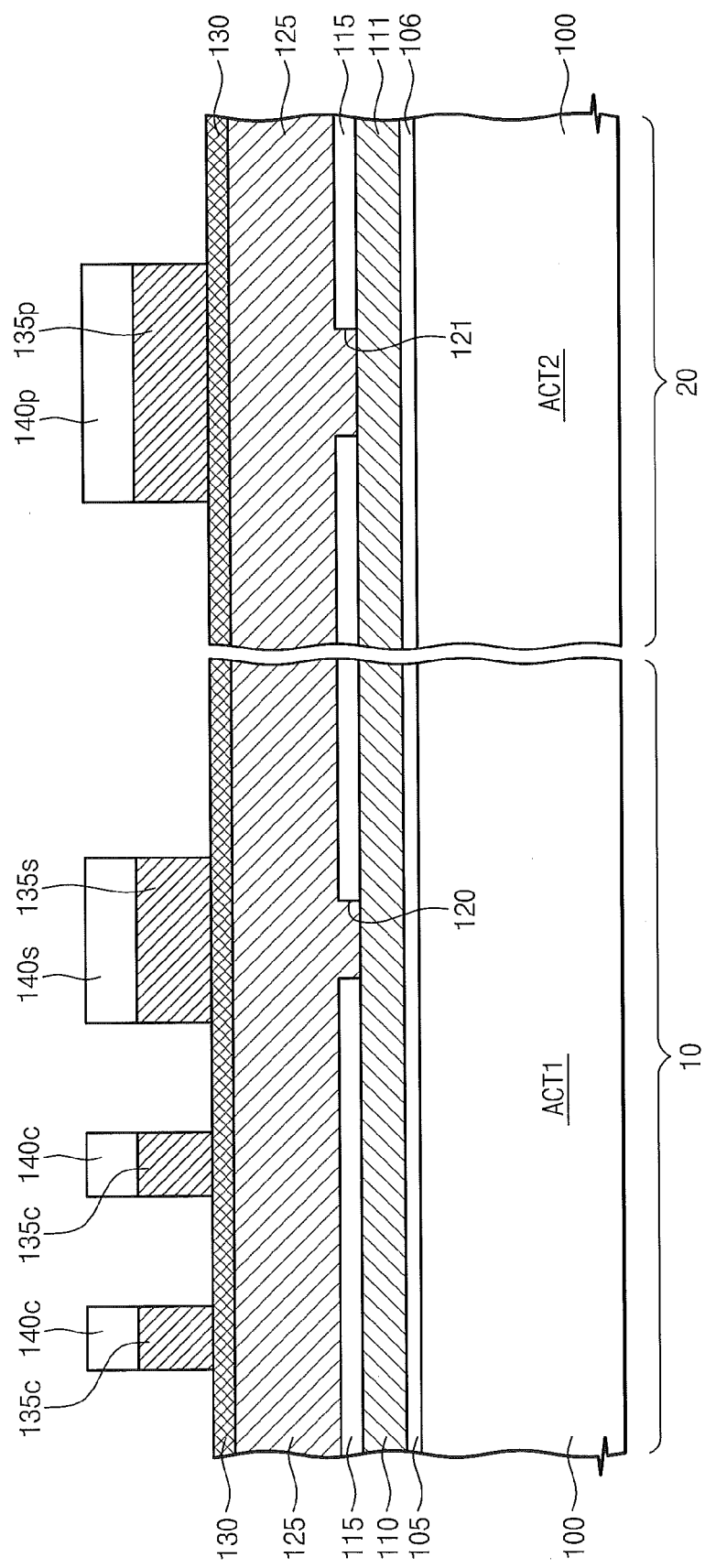

Referring to FIG. 6, the metal layer 135 may be etched by a first etching process, using the control, selection, and peripheral hard mask patterns 140c, 140s, and 140p as etching masks. Thus, a preliminary control metal gate 135c, a preliminary selection metal gate 135s, and a preliminary peripheral metal gate 135p may be formed under the control hard mask pattern 140c, the selection hard mask pattern 140s, and the peripheral hard mask pattern 140p, respectively. The barrier layer 130 may be used as an etch stop layer during the first etching process. The first etching process may be a substantially anisotropic etching process.

Figure 7:
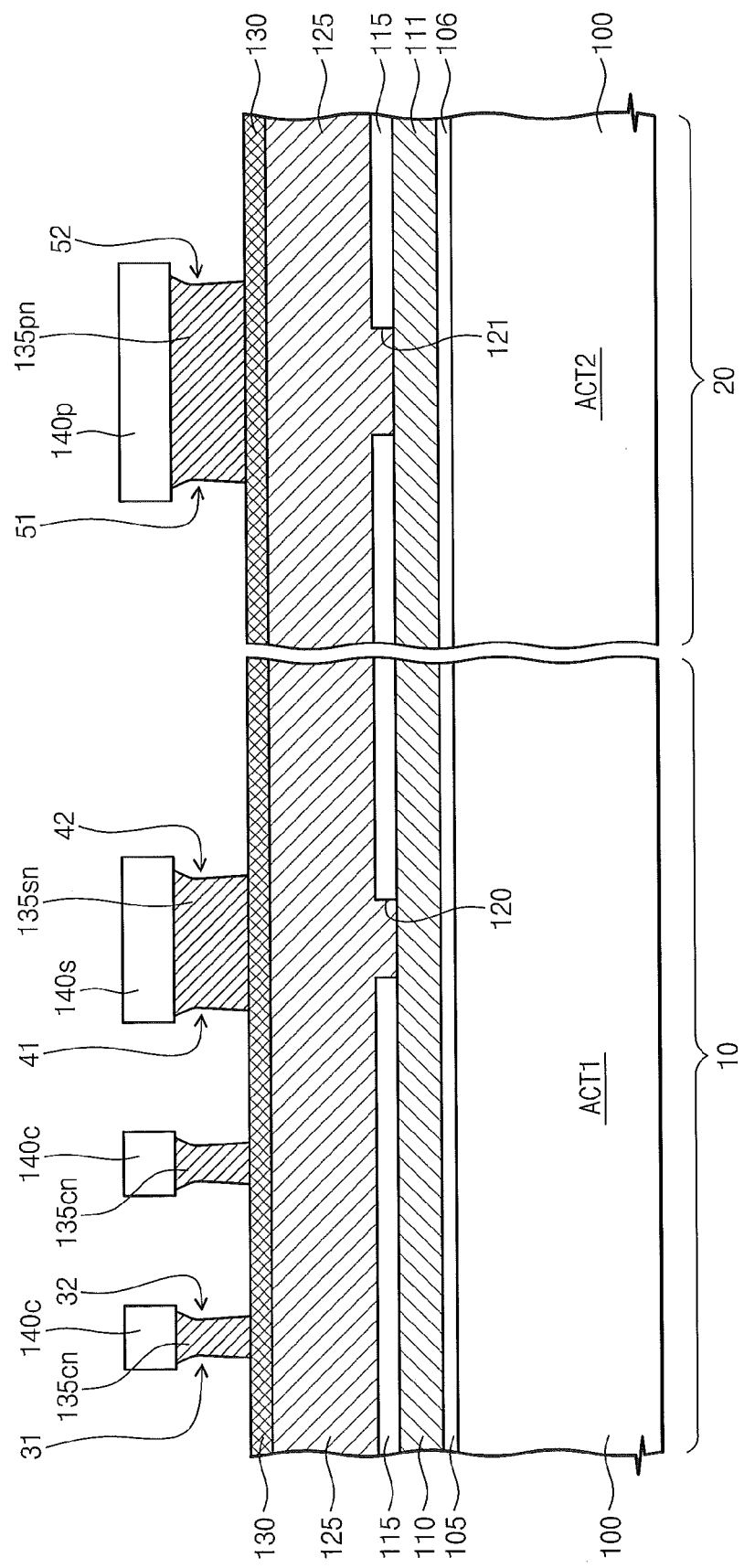

Referring to FIG. 7, a second etching process may be performed to laterally etch both sidewalls of the preliminary control, preliminary selection, and preliminary peripheral metal gates 135c, 135s, and 135p. Thus, control metal gates 135cn, a selection metal gate 135sn, and a peripheral metal gate 135pn may be formed. At this time, a preliminary first control undercut region 31 and a preliminary second control undercut region 32 may be formed at both sides of the control metal gate 135cn, and a preliminary first selection undercut region 41 and a preliminary second selection undercut region 42 may be formed at both sides of the selection metal gate 135sn. Also, a preliminary first peripheral undercut region 51 and a preliminary second peripheral undercut region 52 may be formed at both sides of the peripheral metal gate 135pn. The second etching process laterally etching the preliminary control, selection, and peripheral metal gates 135c, 135s, and 135p may be an etching process having dominant isotropy. For example, the second etching process may be a wet etching process, or a dry etching process having dominant isotropy. In some embodiments, when the metal layer 135 includes tungsten, the second etching process may be a wet etching process using ozone. However, the inventive concept is not limited thereto.

A horizontal depth of the preliminary second selection undercut region 42 may be greater than that of the preliminary first selection undercut region 41. Each of horizontal depths of the preliminary first and second peripheral undercut regions 51 and 52 may be greater than that of the preliminary first control under region 31 or the preliminary second control under region 32. Also, the horizontal depth of the preliminary second selection undercut region 42 may be greater than that of the preliminary first control under region 31 or the preliminary second control under region 32.

Figure 8:
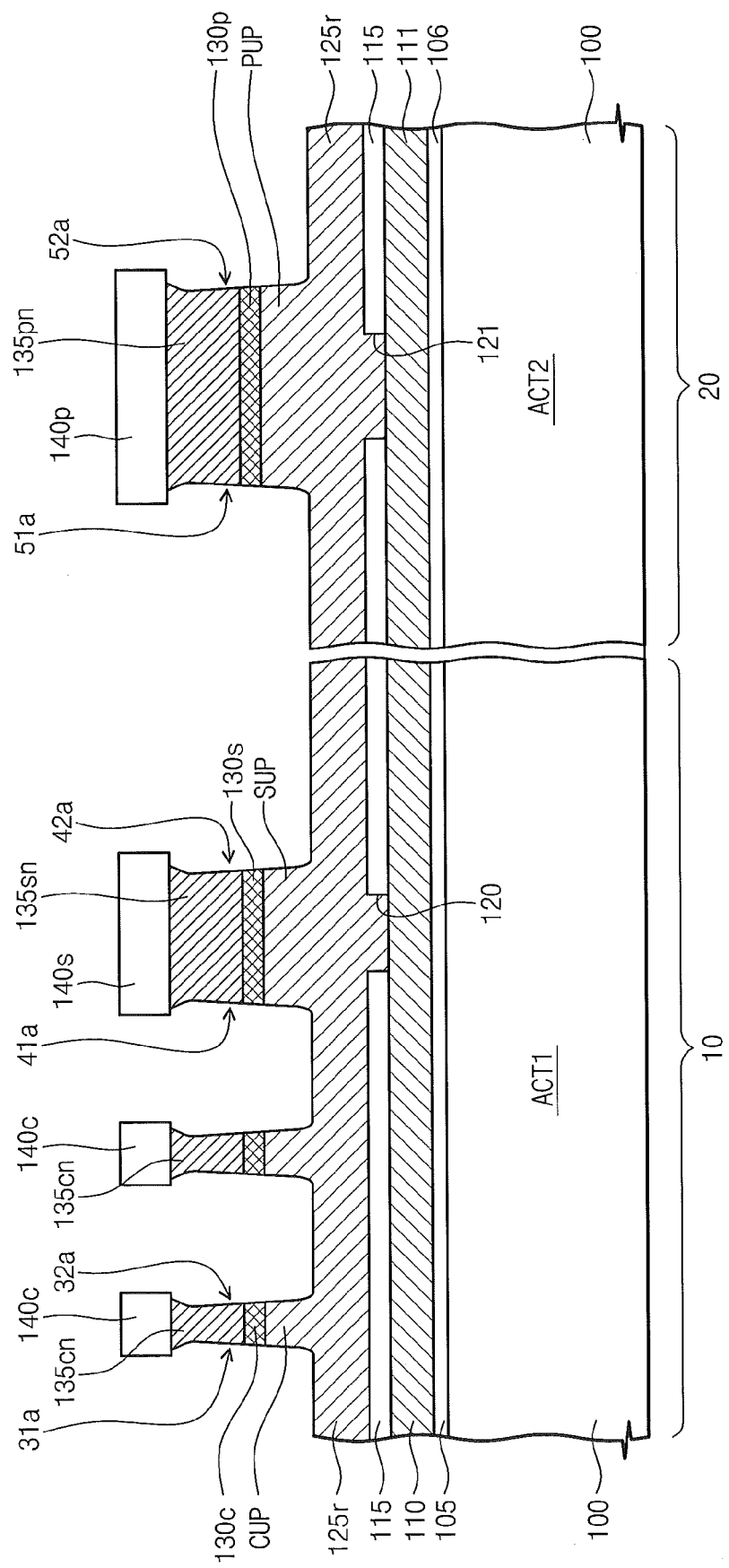

Referring to FIG. 8, using the control, selection, and peripheral hard mask patterns 140c, 140s, and 140p and the control, selection, and peripheral metal gates 135cn, 135sn, and 135pn as etching masks, a third etching process may be performed to successively etch the barrier layer 130 and an upper portion of the conductive layer 125. At this time, a lower portion of the conductive layer 125 may not be etched. By the third etching process, a control barrier pattern 130c, a selection barrier pattern 130s, and a peripheral barrier pattern 130p may be formed under the control metal gate 135cn, the selection metal gate 135s, and the peripheral metal gate 135pn, respectively. Also, a control protruding portion CUP, a selection protruding portion SUP, and a peripheral protruding portion PUP may be formed under the control barrier pattern 130c, the selection barrier pattern 130s, and the peripheral barrier pattern 130p, respectively. The protruding portions CUP, SUP, and PUP may correspond to portions of the upper portion of the conductive layer 125 which remain under the barrier patterns 130c, 130s, and 130p.

Both sidewalls of the control barrier pattern 130c and both sidewalls of the control protruding portion CUP may be self-aligned with both sidewalls of the control metal gate 135cn by the third etching process. Widths of the control protruding portion CUP and the control barrier pattern 130c may be less than that of the control hard mask pattern 140c. Thus, a first control undercut region 31a may be formed beside first sidewalls of the control metal gate 135cn, the control barrier pattern 130c, and the control protruding portion CUP. And a second control undercut region 32a may be formed beside second sidewalls of the control metal gate 135cn, the control barrier pattern 130c, and the control protruding portion CUP.

Similarly, both sidewalls of the selection barrier pattern 130s and both sidewalls of the selection protruding portion SUP may be self-aligned with both sidewalls of the selection metal gate 135sn. Widths of the selection protruding portion SUP and the selection barrier pattern 130s may be less than that of the selection hard mask pattern 140s. Thus, first and second selection undercut regions 41a and 42a may be formed beside first sidewalls and second sidewalls of the selection metal gate 135sn, the selection barrier pattern 130s, and the selection protruding portion SUP, respectively.

Both sidewalls of the peripheral barrier pattern 130p and both sidewalls of the peripheral protruding portion PUP may be self-aligned with both sidewalls of the peripheral metal gate 135pn. Widths of the peripheral protruding portion PUP and the peripheral barrier pattern 130p may be less than that of the peripheral hard mask pattern 140p. Thus, first and second peripheral undercut regions 51a and 52a may be formed beside first sidewalls and second sidewalls of the peripheral metal gate 135pn, the peripheral barrier pattern 130p, and the peripheral protruding portion PUP, respectively.

The third etching process may be a dry etching process having dominant anisotropy. In this case, the third etching process may include a minor lateral etching component.

The control, selection, and peripheral protruding portions CUP, SUP, and PUP may correspond to upper portions of a control base gate, a selection sub-gate, and a peripheral sub-gate, respectively. The control base gate, the selection sub-gate, and the peripheral sub-gate will be described below.

Figure 9:
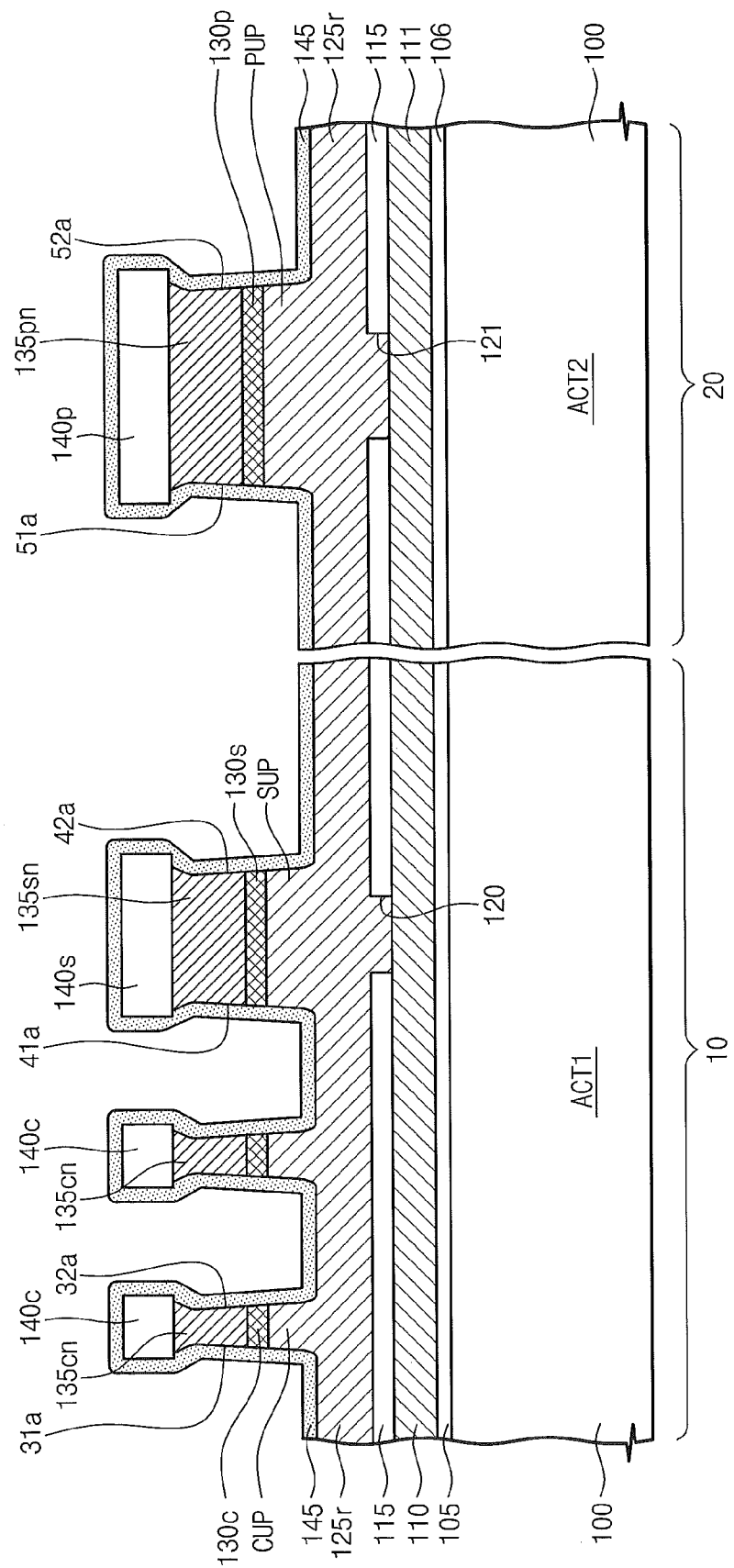

Referring to FIG. 9, a protection spacer layer 145 may be conformably formed on the substrate 100 having the undercut regions 31a, 32a, 41a, 42a, 51a, and 52a. The protection spacer layer 145 may be formed in the undercut regions 31a, 32a, 41a, 42a, 51a, and 52a and on a lower portion 125r of the conductive layer.

Figure 10:
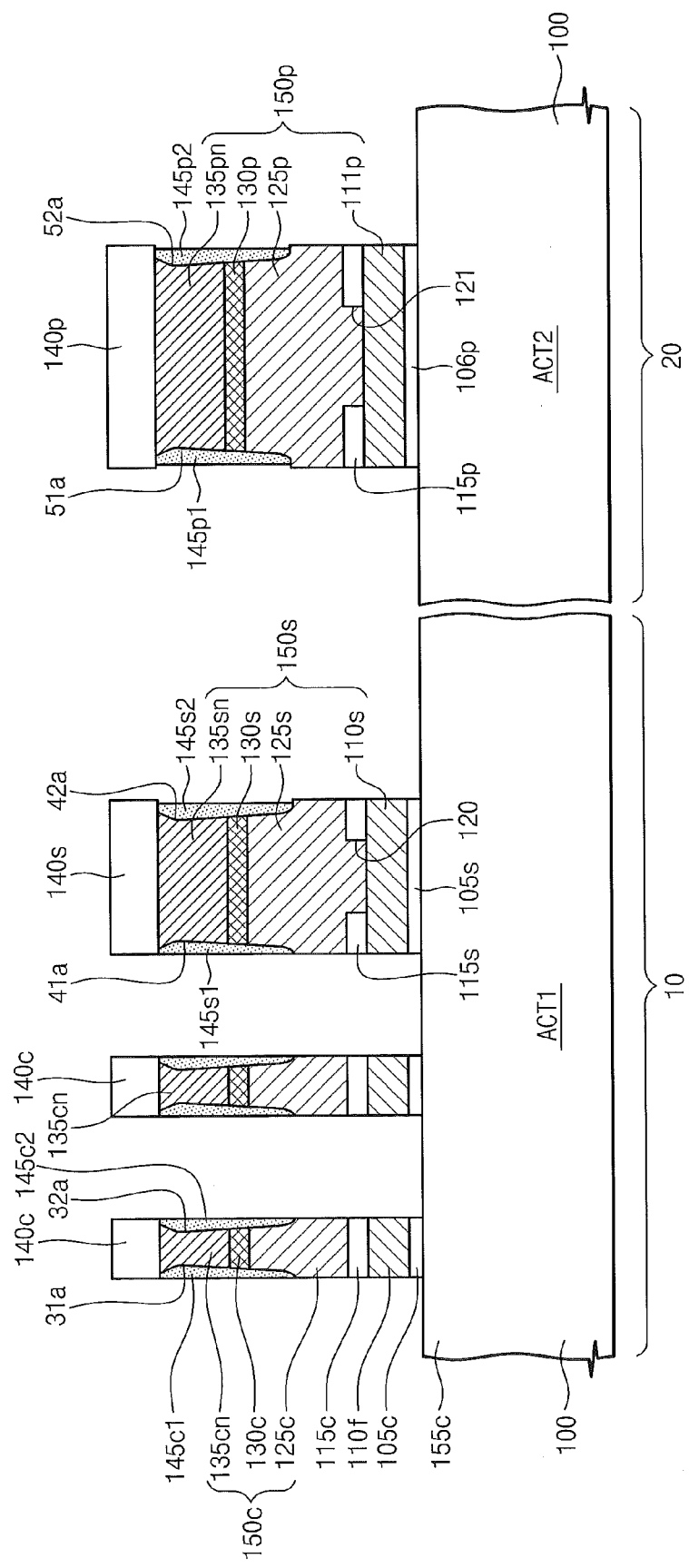

Referring to FIG. 10, the protection spacer layer 145, the lower portion 125r of the conductive layer, the blocking dielectric layer 115, the semiconductor patterns 110 and 111 and the dielectric layers 105 and 106 may be successively etched using the hard mask patterns 140c, 140s, and 140p as etching masks. Thus, cell gate patterns, a selection page pattern and a peripheral gate pattern may be formed. Also, first and second control protection spacers 145c1 and 145c2, first and second selection protection spacers 145s1 and 145s2, and first and second peripheral protection spacers 145p1 and 145p2 are formed.

As described with reference to FIGS. 1, 2A, 2B, and 2C, each of the cell gate patterns may include a tunnel dielectric layer 105c, a charge storage layer 110f, a blocking dielectric layer 115c, a control gate electrode 150c, and a control hard mask pattern 140c which are sequentially stacked. The selection gate pattern may include a selection gate dielectric layer 105s, a selection gate electrode 150s, and a selection hard mask pattern 140s which are sequentially stacked. The peripheral gate pattern may include a peripheral gate dielectric layer 106p, a peripheral gate electrode 150p and a peripheral hard mask pattern 140p which are sequentially stacked. The lower portion 125r of the conductive layer is etched to form the lower portion CLP of the control base gate 125c in FIG. 2A, the lower portion SLP of the selection sub-gate 125s in FIG. 2B, and the lower portion PLP of the peripheral sub-gate 125p in FIG. 2C. When the cell, selection and peripheral gate patterns are formed, the selection and peripheral interlayer patterns 115s and 115p described with reference to FIGS. 1, 2B and 2C may be formed.

After the cell, selection, and peripheral gate patterns are formed, the protection spacer layer 145 on both sidewalls and a top surface of each of the hard mask patterns 140c, 140s, and 140p may be completely removed. Thus, the protection spacers 145c1, 145c2, 145s1, 145s2, 145p1, and 145p2 may not cover both sidewalls of each of the hard mask patterns 140c, 140s, and 140p. Also, since the protection spacer layer 145 is formed on the lower portion 125r of the conductive layer, the protection spacers 145c1, 145c2, 145s1, 145s2, 145p1, and 145p2 may not cover both sidewalls of each of the lower portions of the control base gate 125c, the selection sub-gate 125s, and the peripheral sub-gate 125p.

After the cell, selection, and peripheral gate patterns are formed, a gate oxidation process and/or a cleaning process may be performed.

Figure 11:
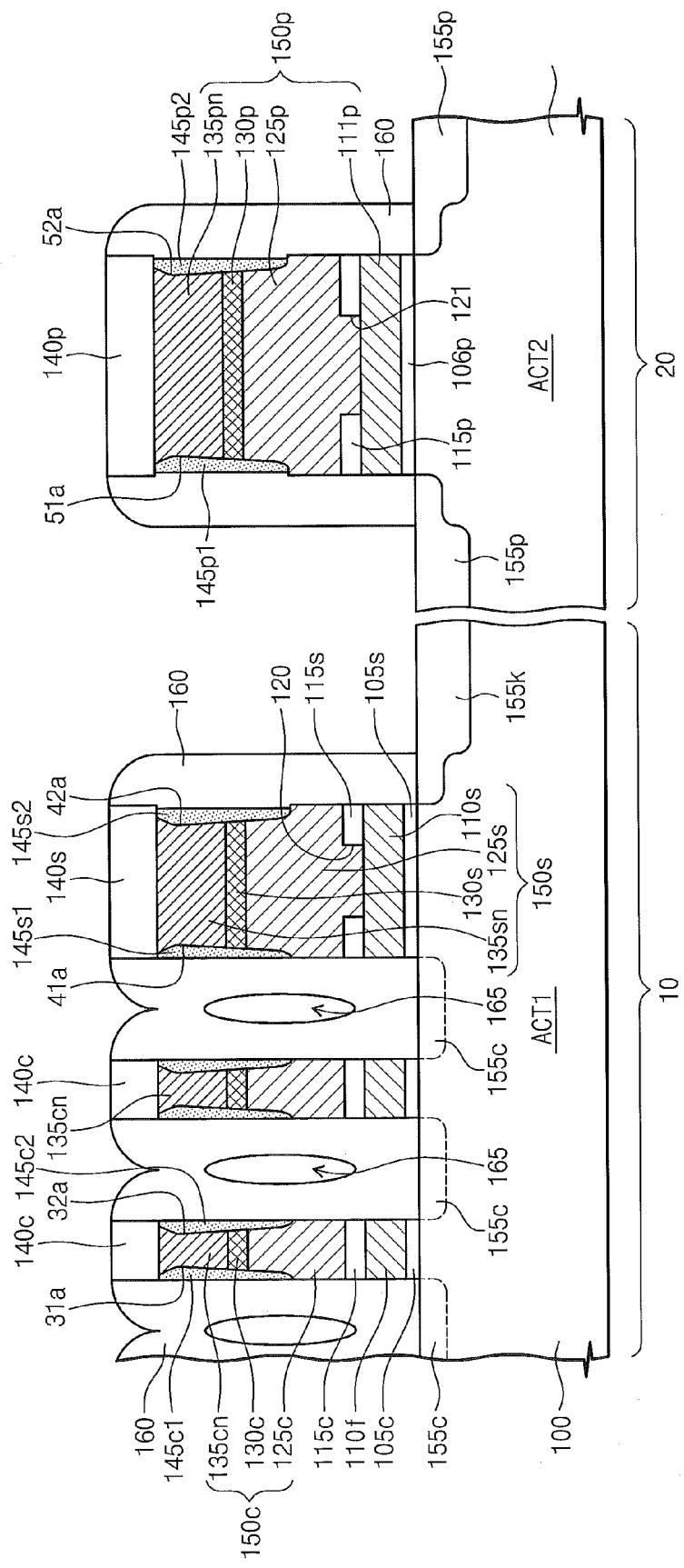

Referring to FIG. 11, cell source/drain regions 155c may be defined in the first active portion ACT1 at both sides of each of the cell gate patterns. A common doped region 155k may be formed in the first active portion ACT1 at a side of the selection gate pattern. Peripheral source/drain regions 155p may be formed in the second active portion ACT2 at both sides of the peripheral gate pattern. The common doped region 155k and the peripheral source/drain regions 155p may be formed simultaneously or sequentially.

Gate spacers 160 may be formed both sidewalls of each of the cell, selection, and peripheral gate patterns. The common doped region 155k and/or the peripheral source/drain regions 155p may be formed to have a LDD structure using the gate spacers 160. Subsequently, the interlayer dielectric layer 170 of FIG. 1 may be formed. Thus, the non-volatile memory device described with reference to FIGS. 1, 2A, 2B, and 2C may be realized.

According to the above method, after the metal gates 135cn, 135sn, and 135pn and the preliminary undercut regions 31, 32, 41, 42, 51, and 52 are formed, the barrier layer 130 and the upper portion of the conductive layer 125 may be etched. Thus, the undercut regions 31a, 32a, 41a, 42a, 51a, and 52a can be formed. As a result, the protection spacers 145c1, 145c2, 145s1, 145s2, 145p1, and 145p2 can also cover both sidewalls of the protruding portions CUP, SUP, and PUP to sufficiently protect the metal gates 135cn, 135sn, and 135pn and the barrier patterns 130c, 130s, and 130p.

Next, a method of manufacturing the non-volatile memory device illustrated in FIG. 3 will be described with reference to FIGS. 12 to 14.

Figure 12:
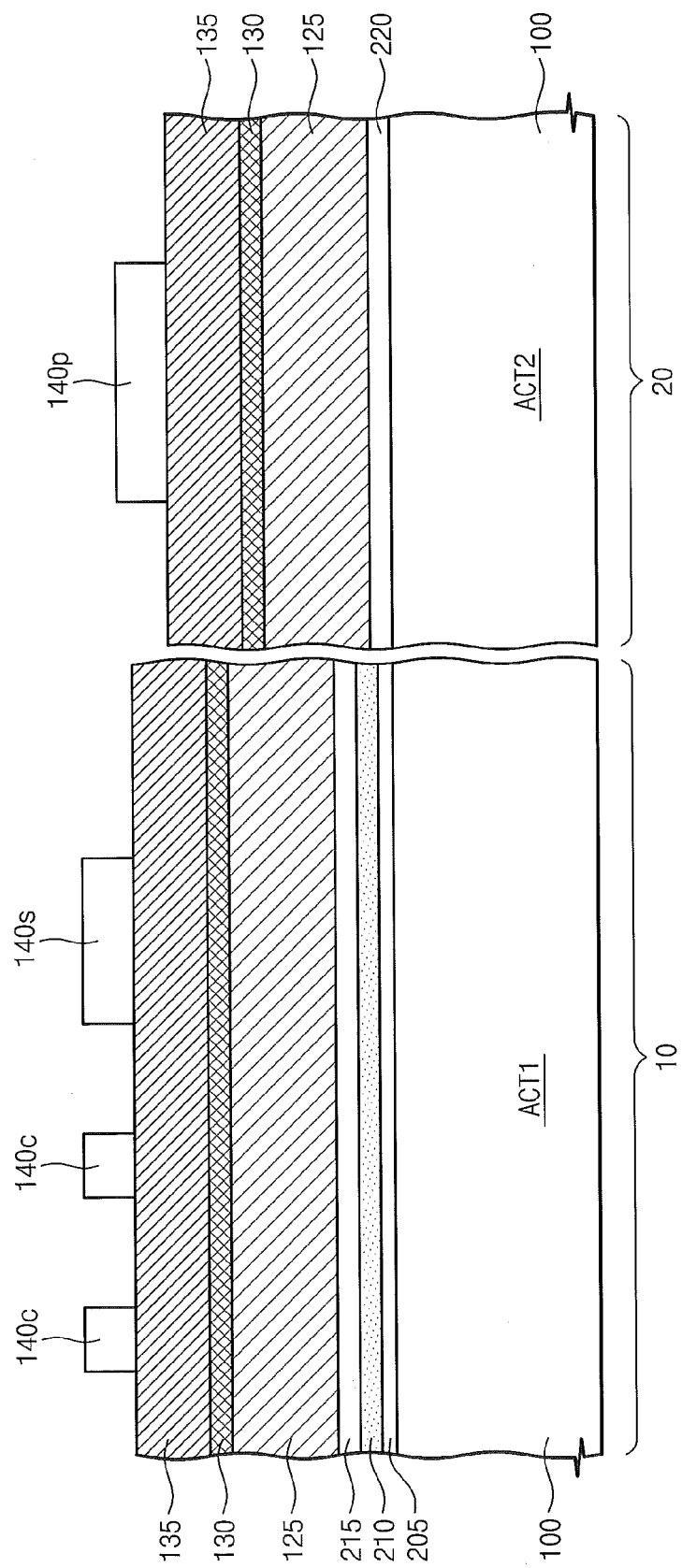
FIGS. 12 to 14 are cross sectional views illustrating methods of manufacturing non-volatile memory devices according to further embodiments of the inventive concept.
Figure 13:
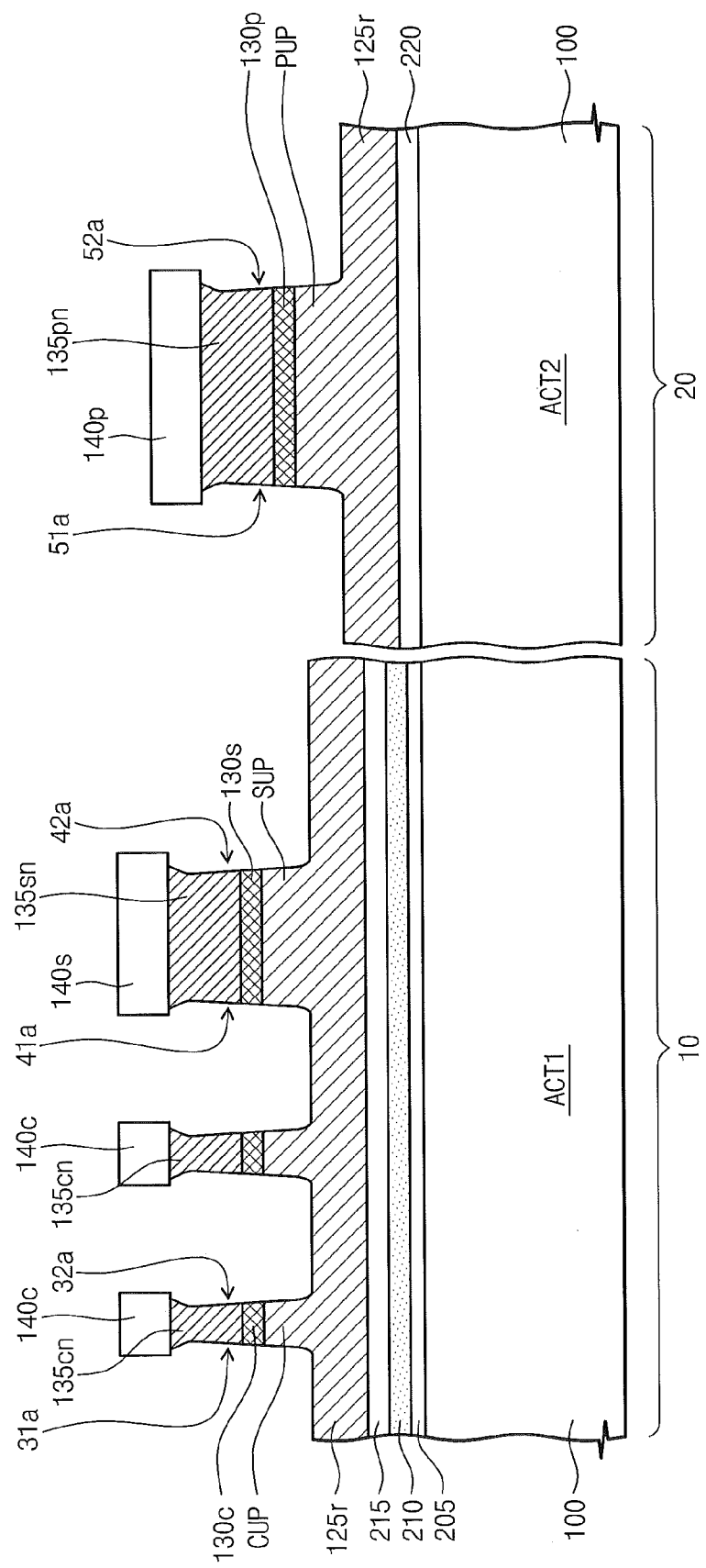
Figure 14:
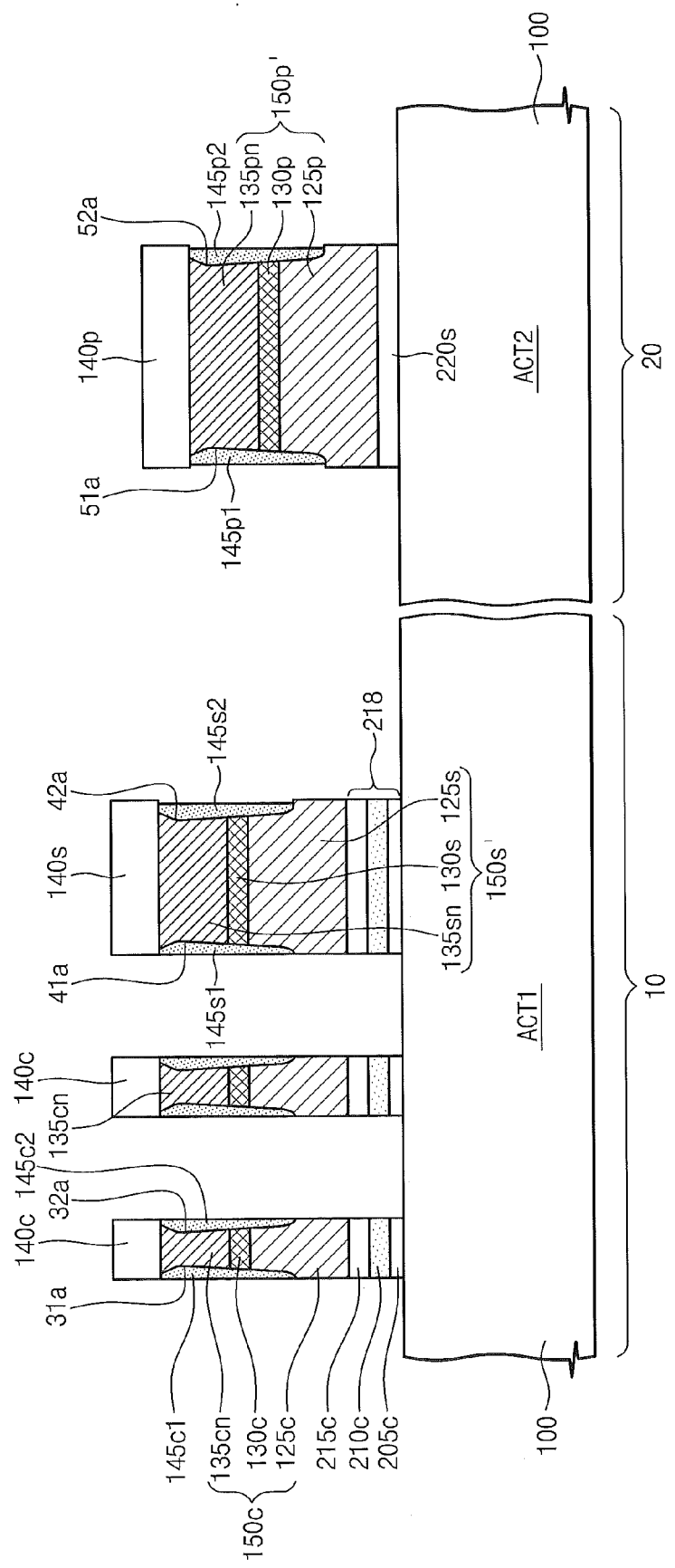

FIGS. 12 to 14 are cross sectional views illustrating a method of manufacturing a modified embodiment of non-volatile memory devices according to embodiments of the inventive concept.

Referring to FIG. 12, a device isolation pattern (not shown) may be formed on the substrate 100 to define first and second active portions ACT1 and ACT2. A tunnel dielectric layer 205, a charge storage layer 210, and a blocking dielectric layer 215 may be sequentially formed on an entire surface of the substrate 100. Subsequently, the blocking dielectric layer 215, the charge storage layer 210, and the tunnel dielectric layer 205 in the second region 20 may be removed, while the blocking dielectric layer 215, the charge storage layer 210, and the tunnel dielectric layer 205 in the second region 10 may remain. Subsequently, a peripheral gate dielectric layer 220 may be formed on the second active portion ACT2.

Subsequently, the conductive layer 125, the barrier layer 30 and the metal layer 135 may be sequentially formed on the entire surface of the substrate 100. Cell, selection and peripheral hard mask patterns 140c, 140s, and 140p may be formed on the metal layer 135.

Next, the methods described with reference to FIGS. 6 to 8 may be performed. Thus, as illustrated in FIG. 13, undercut regions 31a, 32a, 41a, 42a, 51a, and 52a, metal gates 135cn, 135sn, and 135pn, barrier patterns 130c, 130s, and 130p, and protruding portions CUP, SUP, and PUP may be formed. At this time, the lower portion 125r of the conductive layer may remain.

Subsequently, the formation method of the protection spacer layer 145 of FIG. 9 and the etching method described with reference to FIG. 10 may be sequentially performed. Thus, the cell, selection, and peripheral gate patterns and the protection spacers 145c1, 145c2, 145s1, 145s2, 145p1, and 145p2 illustrated in FIG. 14 may be formed. Next, the formation methods described with reference to FIG. 11 may be performed. As a result, the non-volatile memory device illustrated in FIG. 3 may be realized.

The non-volatile memory devices described above may be encapsulated using various packaging techniques. For example, the non-volatile memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique and a wafer-level processed stack package (WSP) technique.

The package in which the non-volatile memory device according to one of the above embodiments is mounted may further include at least one semiconductor device (e.g., a controller and/or a logic device) that controls the non-volatile memory device.

As described above, the first and second control protection spacers are disposed on both sidewalls of the control metal gate and both sidewall of the upper portion of the control base gate. Thus, oxidization of the control metal gate and/or contamination caused by metal atoms in the control metal gate may be reduced or avoided due to the first and second protection spacer. Also, the widths of the control metal gate and the upper portion of the control base gate are less than that of the control hard mask pattern. Thus, the first and second protection spacers may not substantially increase the width of the gate pattern. Additionally, due to the control metal gate, the resistance of a control gate electrode may be lowered. Thus, a non-volatile memory device capable of high speed operation may be realized.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A non-volatile memory device comprising:
   a base gate, a metal gate, and a hard mask pattern sequentially stacked on a semiconductor layer, a first width of a lower portion of the metal gate and a second width of an upper portion of the base gate being less than a third width of the hard mask pattern;
   a first protection spacer on a first sidewall of the metal gate and a first sidewall of the upper portion of the base gate;
   a second protection, spacer on a second sidewall of the metal gate and a second sidewall of the upper portion of the base gate; and
   a tunnel dielectric layer, a charge storage layer and a blocking dielectric layer sequentially stacked between the semiconductor layer and the base gate;
   wherein the first and second sidewalls of the metal gate and the upper portion of the base gate define respective first and second undercut regions, wherein the first and second protection spacers are in the first and second undercut regions; and
   wherein the first and second undercut regions extend into the base gate and the metal gate beneath overhanging portions of the metal gate that have a fourth width that is greater than the second width.

2. The non-volatile memory device of claim 1, wherein the first and second protection spacers do not cover sidewalls of the hard mask pattern.

3. The non-volatile memory device of claim 1, wherein the first and second protection spacers do not cover sidewalls of a lower portion of the base gate.

4. The non-volatile memory device of claim 1, further comprising:
   a barrier pattern disposed between the metal gate and the base gate,
   wherein the first and second protection spacers cover opposing sidewalls of the barrier pattern, respectively.

5. The non-volatile memory device of claim 4, wherein a width of the barrier pattern is less than the third width of the hard mask pattern.

6. The non-volatile memory device of claim 1, wherein the undercut regions comprise a first undercut region defined beside the first sidewalls of the metal gate and the upper portion of the base gate and
   a second undercut region is defined beside the second sidewalls of the metal gate and the upper portion of the base gate; and
   wherein the first and second protection spacers are disposed in the first and second undercut regions, respectively.

7. The non-volatile memory device of claim 6, further comprising:
   a selection sub-gate, a selection metal gate and a selection hard mask pattern sequentially stacked on the semiconductor layer disposed at a side of the base gate, a width of the selection metal gate and a width of an upper portion of the selection sub-gate being less than a width of the selection hard mask pattern;
   a first selection protection spacer disposed in a first selection undercut region which is defined beside a first sidewall of the selection metal gate and a first sidewall of the upper portion of the selection sub-gate;
   a second selection protection spacer disposed in a second selection undercut region which is defined beside a second sidewall of the selection metal gate and a second sidewall of the upper portion of the selection sub-gate; and
   a selection gate dielectric layer disposed between the selection sub-gate and the semiconductor layer,
   wherein a horizontal depth of the first selection undercut region relative to a first sidewall of the selection hard mask pattern is different from a horizontal depth of the second selection undercut region relative to a second sidewall of the selection hard mask pattern.

8. The non-volatile memory device of claim 7, wherein the first sidewall of the selection metal gate is adjacent to the metal gate, and the second sidewall of the selection metal gate is opposite to the first sidewall of the selection metal gate; and wherein the horizontal depth of the second selection undercut region is greater than the horizontal depth of the first selection undercut region.

9. The non-volatile memory device of claim 7, further comprising:

a selection barrier pattern disposed between the selection sub-gate and the selection metal gate, wherein the first and second selection protection spacers cover opposing sidewalls of the selection barrier pattern, respectively.

10. The non-volatile memory device of claim 6, wherein the semiconductor layer includes a first region and a second region, and the base gate, the metal gate and the hard mask pattern are disposed on the semiconductor layer in the first region, the non-volatile memory device, further comprising;

a peripheral sub-gate, a peripheral metal gate, and a peripheral hard mask pattern sequentially stacked on the semiconductor layer in the second region, a width of the peripheral metal gate and a width of an upper portion of the peripheral sub-gate being less than a width of the peripheral hard mask pattern;

a first peripheral protection spacer disposed in a first peripheral undercut region which is defined beside a first sidewall of the peripheral metal gate and a first sidewall of the upper portion of the peripheral sub-gate;

a second peripheral protection spacer disposed in a second peripheral undercut region which is defined beside a second sidewall of the peripheral metal gate and a second sidewall of the upper portion of the peripheral sub-gate; and a peripheral gate dielectric layer disposed between the peripheral sub-gate and the semiconductor layer, wherein horizontal depths of the first and second peripheral undercut regions relative to respective first and second sidewalls of the peripheral hard mask pattern are greater than a horizontal depth of the first undercut region relative to a first sidewall of the hard mask pattern and a horizontal depth of the second undercut region relative to a second sidewall of the hard mask pattern.

11. The non-volatile memory device of claim 10, further comprising:

a peripheral barrier pattern disposed between the peripheral sub-gate and the peripheral metal gate, wherein the first and second peripheral protection spacers cover opposing sidewalls of the peripheral barrier pattern, respectively.

12. The non-volatile memory device of claim 1, wherein the lower portion of the metal gate and the upper portion of the base gate have respective widths that increase as a function of distance from the overhanging portions of the metal gate.

* * * * *